United States Patent
Koda et al.

(10) Patent No.: US 9,751,705 B2
(45) Date of Patent: Sep. 5, 2017

(54) SHEET TRANSPORT DEVICE, IMAGE READING DEVICE, AND IMAGE FORMING APPARATUS

(71) Applicant: FUJI XEROX Co., Ltd., Tokyo (JP)

(72) Inventors: Kazuyuki Koda, Kanagawa (JP); Takakiyo Toba, Kanagawa (JP); Masato Serikawa, Kanagawa (JP); Takato Kato, Kanagawa (JP)

(73) Assignee: FUJI XEROX CO., LTD., Tokyo (JP)

( * ) Notice: Subject to any disclaimer, the term of this patent is extended or adjusted under 35 U.S.C. 154(b) by 0 days.

(21) Appl. No.: 15/003,420

(22) Filed: Jan. 21, 2016

(65) Prior Publication Data

US 2017/0022018 A1    Jan. 26, 2017

(30) Foreign Application Priority Data

Jul. 22, 2015  (JP) ................ 2015-144638

(51) Int. Cl.
B65H 5/26 (2006.01)
B65H 3/06 (2006.01)
B65H 5/06 (2006.01)
H04N 1/00 (2006.01)
G06K 15/16 (2006.01)
G03G 15/00 (2006.01)
G03F 7/20 (2006.01)

(52) U.S. Cl.
CPC ........... *B65H 3/0669* (2013.01); *B65H 5/068* (2013.01); *B65H 5/26* (2013.01); *G03G 15/602* (2013.01); *G06K 15/16* (2013.01); *H04N 1/00* (2013.01); *H04N 1/00795* (2013.01); *B65H 2403/40* (2013.01); *G03F 7/70* (2013.01); *G03G 15/65* (2013.01); *G03G 15/6511* (2013.01); *G03G 2221/1657* (2013.01)

(58) Field of Classification Search
CPC .......... B65H 2402/52; B65H 2402/521; B65H 2402/5211; B65H 2402/522; B65H 2402/5221; B65H 2402/52211; B65H 2402/441; B65H 2404/144; B65H 2404/1521; B65H 2401/211; G03G 15/602
See application file for complete search history.

(56) References Cited

U.S. PATENT DOCUMENTS

| 6,598,378 B1* | 7/2003 | Pottier | B65B 11/00 492/45 |
| 2007/0267806 A1* | 11/2007 | Graef | B65H 5/025 271/145 |
| 2011/0317198 A1* | 12/2011 | Suzuki | B41M 7/0009 358/1.13 |
| 2012/0234655 A1* | 9/2012 | Dong | H04N 1/00795 198/780 |

FOREIGN PATENT DOCUMENTS

JP    2010-202294 A    9/2010

* cited by examiner

*Primary Examiner* — Jeremy R Severson
(74) *Attorney, Agent, or Firm* — Sughrue Mion, PLLC

(57) ABSTRACT

A sheet transport device includes a feeding unit that feeds out a sheet from a sheet stack unit, a driving shaft that rotates the feeding unit, plural bearing members that support the driving shaft rotatably at plural positions in an axial direction and restrict movement of the driving shaft in the axial direction, and a fixing member provided integrally with each of the bearing members to removably fix each of the bearing members to an opening and closing member that is opened and closed relative to the sheet stack unit.

6 Claims, 27 Drawing Sheets ent of the driving shaft in the axial direction, and a fixing member provided integrally with each of the bearing members to removably fix each of the bearing members to an opening and closing member that is opened and closed relative to the sheet stack unit.
SHEET TRANSPORT DEVICE, IMAGE READING DEVICE, AND IMAGE FORMING APPARATUS

CROSS-REFERENCE TO RELATED APPLICATIONS

This application is based on and claims priority under 35 USC 119 from Japanese Patent Application No. 2015-144638 filed Jul. 22, 2015.

BACKGROUND

Technical Field

The present invention relates to a sheet transport device, an image reading device, and an image forming apparatus.

SUMMARY

According to an aspect of the invention, there is provided a sheet transport device including a feeding unit that feeds out a sheet from a sheet stack unit, a driving shaft that rotates the feeding unit, plural bearing members that support the driving shaft rotatably at plural positions in an axial direction and restrict movement of the driving shaft in the axial direction, and a fixing member provided integrally with each of the bearing members to removably fix each of the bearing members to an opening and closing member that is opened and closed relative to the sheet stack unit.

BRIEF DESCRIPTION OF THE DRAWINGS

An exemplary embodiment of the present invention will be described in detail based on the following figures, wherein.

DETAILED DESCRIPTION

An exemplary embodiment of the present invention will be described below with reference to the drawings.

Exemplary Embodiment

Figure 1:
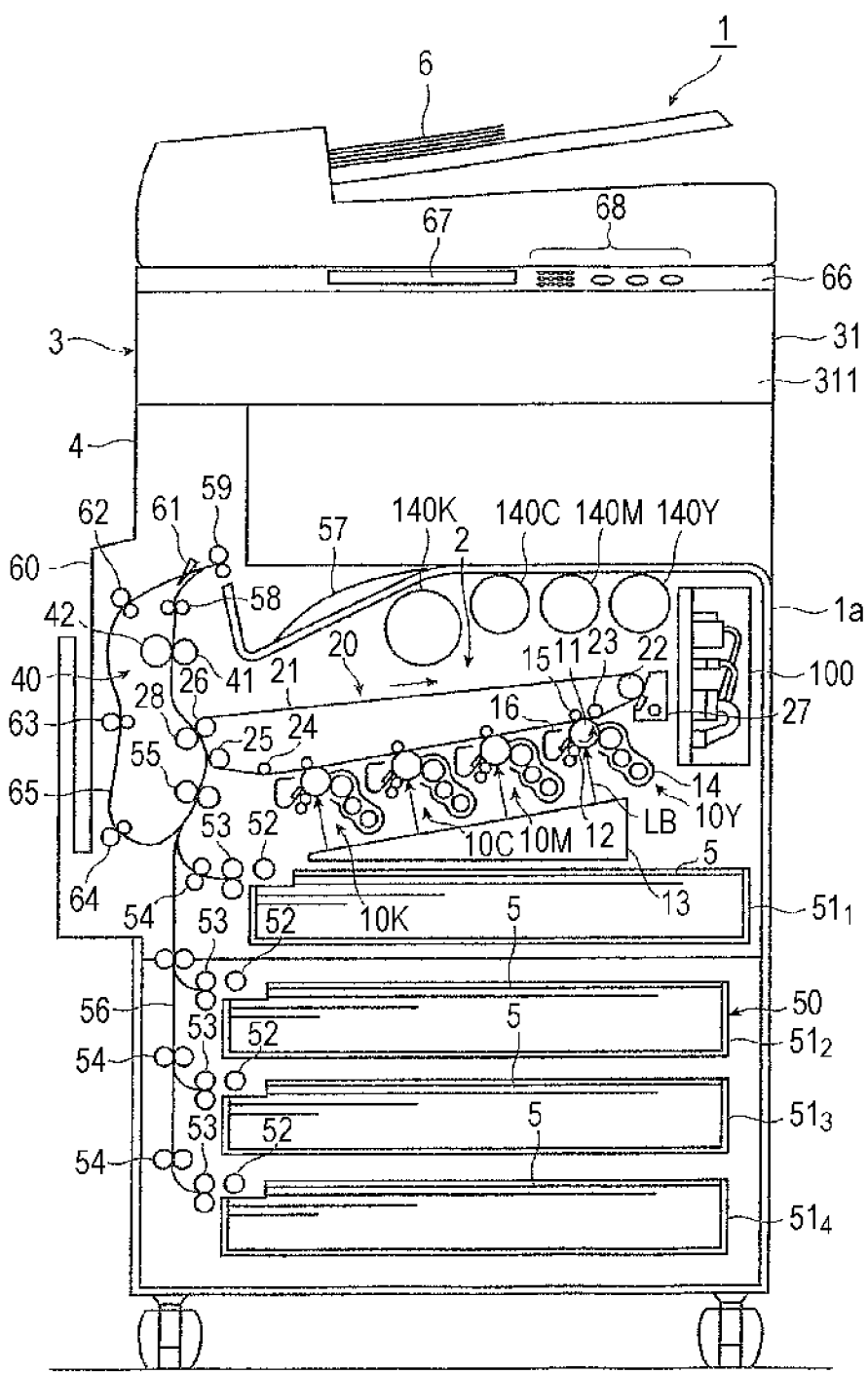
FIG. 1 is an overall configuration view of an image forming apparatus to which a sheet transport device according to an exemplary embodiment of the present invention is applied.

FIG. 1 is an overall configuration view of an image forming apparatus to which a sheet transport device and an image reading device according to an exemplary embodiment of the present invention are applied.

Overall Configuration of Image Forming Apparatus

An image forming apparatus 1 according to the exemplary embodiment is configured as a color copying machine as an example. The image forming apparatus 1 includes an image reading device 3 that reads an image on a document 6 serving as an example of a sheet, and an image forming section 2 serving as an example of an image forming part that forms an image on a recording medium, for example, on the basis of image data read by the image reading device 3. The image reading device 3 is disposed above an apparatus body 1a that houses the image forming section 2 while being supported by a support section 4. Between the image reading device 3 and the apparatus body 1a, a space is provided so that a recording medium on which an image is formed is output therethrough.

As illustrated in FIG. 1, the image reading device 3 is provided with a control panel 66 serving as an operating unit used to operate the image forming apparatus 1 and the image reading device 3. The control panel 66 is provided in an upper part of a front wall 311 located on the front of a housing 31 of the image reading device 3. The control panel 66 includes a touch panel 67 and plural operation buttons 68. The touch panel 67 also serves as a display unit for displaying an operation menu, a warning, a message, and so on to the user, and receives various settings for the displayed operation menu.

The image forming section 2 includes plural image forming devices 10 each of which forms a toner image developed with toner contained in developer, an intermediate transfer device 20 that holds toner images formed by the image forming devices 10 and transports the toner images to a second transfer position where the toner images are to be finally second-transferred onto recording paper 5 serving as an example of a recording medium, a paper feeding device 50 that stores and transports required recording paper 5 to be supplied to the second transfer position in the intermediate transfer device 20, and a fixing device 40 that fixes the toner images second-transferred on the recording paper 5 in the intermediate transfer device 20. The apparatus body 1a is composed of a support structural member, an exterior covering, and so on. The image forming section 2 is not limited to the electrophotographic system, but may adopt another system, such as an inkjet system, a thermal head system, or a lithographic system, as long as it can form images on recording media.

The paper feeding device 50 is disposed to be located below an exposure device 13. The paper feeding device 50 principally includes plural (or singular) sheet containers 51 ($51_1$ to $51_4$) that contain recording paper 5 of a desired size, type, and so on, and feeding devices 52 and 53 that feed out the recording paper 5 one by one from the sheet containers $51_1$ to $51_4$. For example, the sheet containers 51 are mounted to be drawn out toward the front side of the apparatus body 1a (a side surface the user faces during operation).

Between the paper feeding device 50 and the intermediate transfer device 20, a paper feeding and transporting path 56 is provided to transport recording paper 5 fed from the paper feeding device 50 to the second transfer position. The paper feeding and transporting path 56 includes plural paper transport rollers 54 and 55 and unillustrated transport guides. The paper transport roller 55 disposed at a position just before the second transfer position in the paper feeding and transporting path 56 is configurated, for example, as a roller (registration roller) for adjusting the transport time of the recording paper 5. On the downstream side of the fixing device 40 in the sheet transport direction, a transport roller 58 and an output roller 59 are disposed to output the recording paper 5 to an output container 57 provided in the upper part of the apparatus body 1a.

The plural image forming devices 10 are formed by four image forming devices 10Y, 10M, 10C, and 10K that form toner images of four colors of yellow (Y), magenta (M), cyan (C), and black (K), respectively. Each of the image forming devices 10 (Y, M, C, and K) includes a rotary photoconductor drum 11 serving as an example of an image carrier, a charging device 12 that charges a peripheral surface (image bearing surface) of the photoconductor drum 11, on which an image can be formed, with a required potential, an exposure device 13 that forms an electrostatic latent image (for the corresponding color) having a potential difference by radiating light LB based on image information (signals) onto the charged peripheral surface of the photoconductor drum 11, a developing device 14 that develops the electrostatic latent image with toner of developer of the corresponding color (Y, M, C, or K) into a toner image, a first transfer device 15 that transfers the toner image onto the intermediate transfer device 20, and a drum cleaning device 16 that cleans the photoconductor drum 11 by removing attached substances, such as toner, remaining on the image bearing surface of the photoconductor drum 11 after first transfer.

The intermediate transfer device 20 includes an intermediate transfer belt 21, plural transport rollers 22 to 26 that transport the intermediate transfer belt 21 in a direction of arrow, and a belt cleaning device 27 that cleans a surface of the intermediate transfer belt 21 by removing attached substances, such as toner, remaining on and attached to the surface of the intermediate transfer belt 21. A second transfer roller 28 serving as a second transfer device for second-transferring toner images on the intermediate transfer belt 21 together onto recording paper 5 is disposed in contact with the transport roller 26 with the intermediate transfer belt 21 being disposed therebetween.

The fixing device 40 includes a heating rotating body 41 and a pressurizing rotating body 42. A contact portion between the heating rotating body 41 and the pressurizing rotating body 42 forms a fixing portion that fixes the toner images on the recording paper 5.

The image forming apparatus 1 further includes a duplex unit 60 that forms images on both surfaces of recording paper 5. When recording paper 5 having an image formed on one surface is transported to the output container 57 by the output roller 59, it is introduced into the duplex unit 60 through a switch gate 61 by rotating the output roller 59 in an opposite direction while the output roller 59 holds a trailing edge of the recording paper 5. The duplex unit 60 includes a duplex transport path 65 composed of plural transport rollers 62 to 64 for transporting the introduced recording paper 5 in an inverted state, and unillustrated transport guides.

In FIG. 1, each toner cartridge 140 (Y, M, C, or K) serves as a developer container that stores developer including at least toner to be supplied to the corresponding developing device 14. In the exemplary embodiment, only toner is stored inside the toner cartridge 140 (Y, M, C, or K).

A control device 100 controls an image forming operation of the image forming apparatus 1 and an image reading operation of the image reading device 3. A control device for controlling the image reading operation of the image reading device 3 may be provided separately from a control device for the image forming apparatus 1.

Basic Operation of Image Forming Apparatus

The basic image forming operation of the image forming apparatus 1 will be described below.

Here, a description will be given of an image forming operation of forming a full-color image by combining toner images of four colors (Y, M, C, and K) using the four image forming devices 10 (Y, M, C, and K).

When the image forming apparatus 1 receives command information about a request for an image forming operation (printing), the four image forming devices 10 (Y, M, C, and K), the intermediate transfer device 20, the second transfer roller 28, the fixing device 40, and so on start.

In the image forming devices 10 (Y, M, C, and K), toner images of four colors (Y, M, C, and K) are visualized by being developed with the corresponding color toners. When the color toner images formed in the image forming devices 10 (Y, M, C, and K) are transported to the first transfer positions, the first transfer devices 15 first-transfer and superimpose the color toner images in order on the intermediate transfer belt 21 that rotates in the direction of the arrow in the intermediate transfer device 20. Next, in the intermediate transfer device 20, the first-transferred toner images are held and transported to the second transfer position by the rotation of the intermediate transfer belt 21.

On the other hand, in the paper feeding device 50, required recording paper 5 is fed out to the paper feeding and transporting path 56 in response to the image forming operation. In the paper feeding and transporting path 56, the paper transport roller 55 serving as the registration roller feeds and supplies the recording paper 5 to the second transfer position in accordance with the transfer time.

At the second transfer position, the second transfer roller 28 second-transfers the toner images on the intermediate transfer belt 21 together onto the recording paper 5. In the intermediate transfer device 20 after the second transfer is finished, the belt cleaning device 27 cleans the surface of the intermediate transfer belt 21 by removing attached substances, such as toner, remaining on the surface of the intermediate transfer belt 21 after the second transfer.

Next, the recording paper 5 on which the toner images are second-transferred is separated from the intermediate transfer belt 21 and the second transfer roller 28, and is then transported to the fixing device 40. In the fixing device 40, the unfixed toner images are fixed on the recording paper 5 by a necessary fixing operation (heating and pressurization). Finally, after fixing is completed, the recording paper 5 is output to, for example, the output container 57 disposed in the upper part of the apparatus body 1a by the transport roller 58 and the output roller 59.

In a case in which images are formed on both surfaces of recording paper 5, when the recording paper 5 is transported to the output container 57 by the output roller 59 after an image is formed on one surface of the recording paper 5, the rotating direction of the output roller 59 is switched to the opposite direction while the output roller 59 holds a trailing edge of the recording paper 5. The transport direction of the recording paper 5 transported in the opposite direction by the output roller 59 is switched toward the duplex unit 60 by the switch gate 61. After that, the recording paper 5 is transported to the paper transport roller 55 in an inverted state through the duplex transport path 65 including the transport rollers 62 to 64. The paper transport roller 55 sends and supplies the recording paper 5 to the second transfer position in accordance with the transfer time. Then, a toner image is second-transferred from the intermediate transfer belt 21 onto a back surface (second surface) of the recording paper 5 and is then subjected to fixing in the fixing device 40. The recording paper 5 is output with the second surface facing down to the output container 57 disposed in the upper part of the apparatus body 1a by the output roller 59.

Through the above procedure, the recording paper 5 on which a full-color image is formed by combining toner images of four colors is output.

Structure of Image Reading Device

Figure 2:
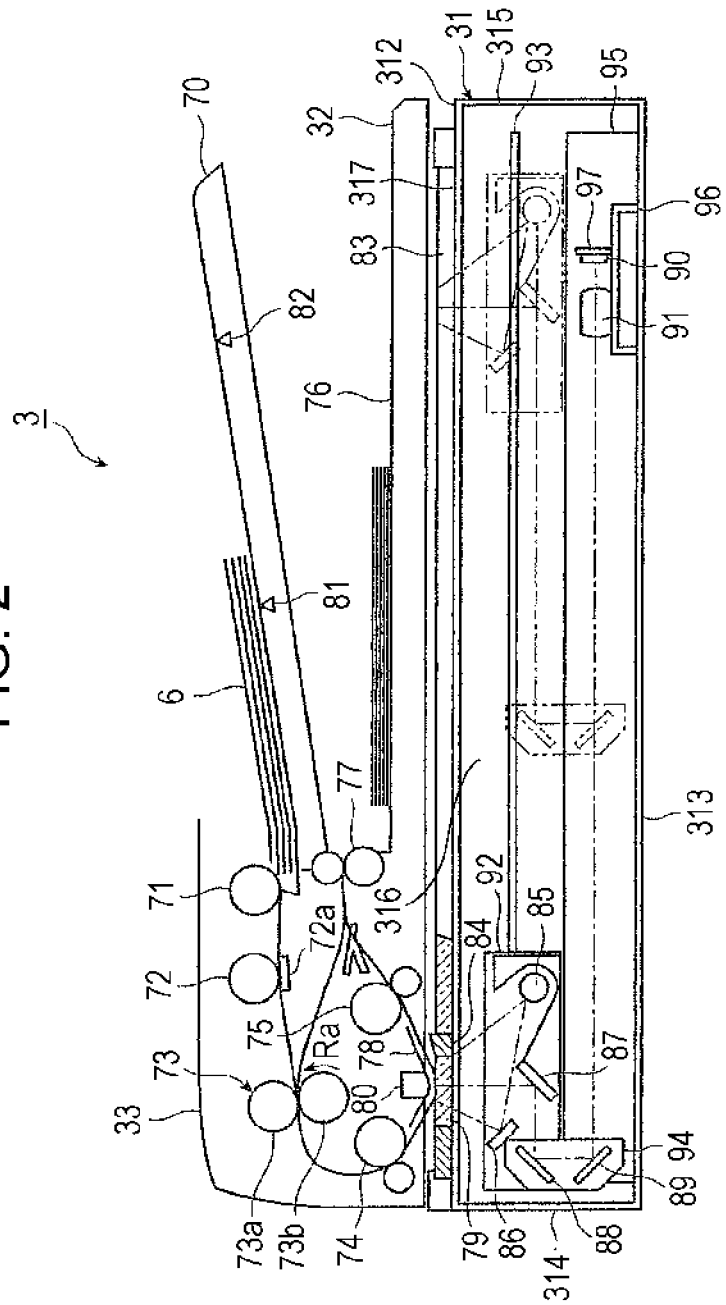
FIG. 2 is a structural view of an image reading device according to the exemplary embodiment.

FIG. 2 schematically illustrates the structure of the image reading device 3 according to the exemplary embodiment.

The image reading device 3 roughly includes a housing 31 having a document reading surface (support surface) on its upper surface, a document press covering 32 openably and closably attached to the housing 31, and a duplex automatic document feeder (DADF) 33 provided at one end (left end in FIG. 2) of the document press covering 32.

In response to the operation of the user, the mode of the image reading device 3 can be switched between a first reading mode for reading images on documents 6 while automatically transporting the documents 6 one by one by the DADF 33 and a second reading mode for reading an image on a document 6 placed on a document table 83 to be described later. FIG. 2 illustrates states of the members when document reading is performed in the first reading mode.

The DADF 33 includes a document transport mechanism that is composed of a document storage unit 70, a nudger roller 71, a feed roller 72, a pressure pad 72a, a first transport roller 73, transport rollers 74 and 75, and an output roller 77. The document storage unit 70 serves as an example of a sheet stack unit on which plural documents 6 can be stacked and stored with their read surfaces (first surfaces) facing up. The nudger roller 71 serves as an example of a feeding unit that feeds out the documents 6 from the document storage unit 70. The feed roller 72 serves as an example of the feeding unit that loosens and supplies the documents 6 fed out by the nudger roller 71 one by one. The pressure pad 72a loosens the documents 6 one by one while being in pressure contact with the feed roller 72. The first transport roller 73 transports a fed document 6 to the reading position. The transport rollers 74 and 75 transport the document 6 transported by the first transport roller 73 so that the document 6 passes through the reading position. The output roller 77 serves as an example of a second transport roller that outputs the document 6 to an output storage unit 76. The nudger roller 71, the feed roller 72, the transport rollers 73 to 75, and the output roller 77 are driven by a driving unit (to be described later) during reading of the document 6. The first transport roller 73 is a registration roller that adjusts the transport time of the document 6 to the reading position. Although not explicitly stated in the exemplary embodiment, the terms "transport roller" and the "output roller" include a pair of rollers.

The first transport roller 73 also functions as a correction unit that mechanically corrects the tilt of the document 6 with respect to the transport direction (hereinafter, referred to as "skew correction") so that the direction of edges of the document 6 becomes the same as the transport direction. As illustrated in FIG. 2, a transport roller 73b serving as a driving roller in the first transport roller 73 is driven by, for example, a driving unit to be described later, such as a driving motor, so as to rotate in a forward direction Ra in FIG. 2 from a stopped state at a predetermined timing. A transport roller 73a serving as a driven roller rotates to follow the transport roller 73b while being in pressure contact with the transport roller 73b.

In the first transport roller 73, while the transport roller 73b serving as the driving roller is stopped, a leading edge of the document 6 transported by the feed roller 72 located on the upstream side in the transport direction of the document 6 abuts on a pressure contact portion between the transport roller 73b and the transport roller 73a. The first transport roller 73 performs skew correction by starting to transport the document 6 after bending a leading end region of the document 6 so that the leading edge of the document 6 coincides with the axial direction of the first transport roller 73.

The DADF 33 further includes a curved reading guide 78, a back-surface support member 80, a first size detection sensor 81, and a second size detection sensor 82. The reading guide 78 guides the document 6 to the reading position and further guides the document 6 from the reading position in the output direction. The back-surface support member 80 is provided on the reading guide 78 above a reading window 79 to support a back surface of the document 6. The first size detection sensor 81 is provided in the document storage unit 70 to detect the size of the document 6 in the sub-scanning direction. The second size detection sensor 82 is also provided in the document storage unit 70 to detect the size of the document 6 in the sub-scanning direction.

The housing 31 of the image reading device 3 is provided as a box shaped like a rectangular parallelepiped whose upper end surface is partly open. The housing 31 includes an upper wall 312 opposed to the document press covering 32, a bottom wall 313 opposed to the upper wall 312, a side wall 314 and a side wall 315 opposed to each other in the sub-scanning direction (a right-left direction in FIG. 2) with the bottom wall 313 being disposed therebetween, the above-described front wall 311 (see also FIG. 1), and a rear wall 316 opposed to the front wall 311 in the main scanning direction (a direction orthogonal to the paper plane of FIG. 2).

The upper wall 312 of the housing 31 has a large rectangular aperture 317 in plan view at a position corresponding to the document reading position for the document 6 to be read in the second reading mode. In the aperture 317, a transparent document table 83 (platen glass) is disposed to support the document 6. A portion of the document table 83 on the side of the DADF 33 has a transparent reading window 79 through which the document 6 is read in the first reading mode. Between the reading window 79 and the document table 83, a guide member 84 having an inclined upper end surface is provided to guide the document 6 to the transport roller 75 after the document 6 passes through the reading position in the first reading mode.

The image reading device 3 includes, inside the housing 31, an image reading section composed of a light source 85, a reflector 86, a first mirror 87, a second mirror 88, a third mirror 89, and an imaging lens 91. The light source 85 serves as an illumination unit, such as an illumination lamp or a light emitting diode (LED), for radiating light for illuminating the document 6. The reflector 86 reflects a part of the light emitted from the light source 85 toward a document 6. The first mirror 87 receives reflected light from the document 6. The second mirror 88 receives reflected light from the first mirror 87. The third mirror 89 receives reflected light from the second mirror 88. The imaging lens 91 focuses reflected light from the third mirror 89 onto an image reading element 90 serving as an example of an image reading unit such as a charge-coupled device (CCD) or a complementary metal oxide semiconductor (CMOS). The light source 85 radiates light toward the document 6 and the reflector 86. The first to third mirrors 87 to 89 and the imaging lens 91 constitute a reading optical system that reads an image on the document 6 with the image reading element 90.

The light source 85, the reflector 86, and the first mirror 87 are arranged in the main scanning direction, and are mounted in a first moving body 92 formed by a carriage that can be moved in the sub-scanning direction by an unillustrated driving unit. The first moving body 92 illuminates a reading target region on the document 6 while moving along a first rail 93 in the sub-scanning direction and reflects reflected light from the document 6 toward the second mirror 88 in a second moving body 94 by using the first mirror 87. The first rail 93 is disposed on the rear wall 316 of the housing 31 to extend in the sub-scanning direction.

The second mirror 88 and the third mirror 89 are arranged in the main scanning direction, and are mounted in a second moving body 94 formed by a carriage that can be moved by the driving unit in the sub-scanning direction. The second moving body 94 reflects reflected light from the document 6 toward the imaging lens 91 in the image reading section while moving in the sub-scanning direction along a second rail 95. The second rail 95 is disposed on the bottom wall 313 of the housing 31 to extend in the sub-scanning direction. The single first rail 93 and the single second rail 95 are arranged to be opposed to opposite end portions in the main scanning direction.

The image reading section includes an image reading substrate 97 on which the image reading element 90 is mounted. The imaging lens 91 and the image reading substrate 97 are attached to a base plate 96 supported by the bottom wall 313. In the image reading section, reflected light from the third mirror 89 passes through the imaging lens 91 and is focused on the image reading element 90 such as a CCD or a CMOS, an image on the document 6 is read by the image reading element 90, and image data is output. The image data read by the image reading element 90 is subjected to a predetermined image processing, such as shading correction, by an unillustrated image processing device as required, and is then transmitted to the control device 100.

In the first reading mode, as shown by a solid line in FIG. 2, documents 6 are automatically transported by the DADF 33 in a state in which the first and second moving bodies 92 and 94 are stopped at the reading position set at the left end of the housing 31, a document 6 passing over the reading window 79 is illuminated by the light source 85, and a reflected light image from the document 6 is reflected by the first mirror 87 toward the imaging lens 91 via the second and third mirrors 88 and 89. In the image reading section, the reflected light image from the third mirror 89 is focused on the image reading element 90 by the imaging lens 91, the image on the document 6 is read by the image reading element 90, and image data is output from the image reading element 90.

In contrast, in the second reading mode, the first moving body 92 and the second moving body 94 are driven by the unillustrated driving unit. The moving amount of the second moving body 94 is set to be half of the moving amount of the first moving body 92 so that the optical path length from the image reading position for the document 6 to the image reading element 90 does not change during movement of the first moving body 92 in the sub-scanning direction. In FIG. 2, two-dot chain lines show the positions of the first moving body 92 and the second moving body 94 when the first moving body 92 is moved to near an end portion in the sub-scanning direction for the document 6.

Structure of Principal Part of Image Reading Device

Figure 3:
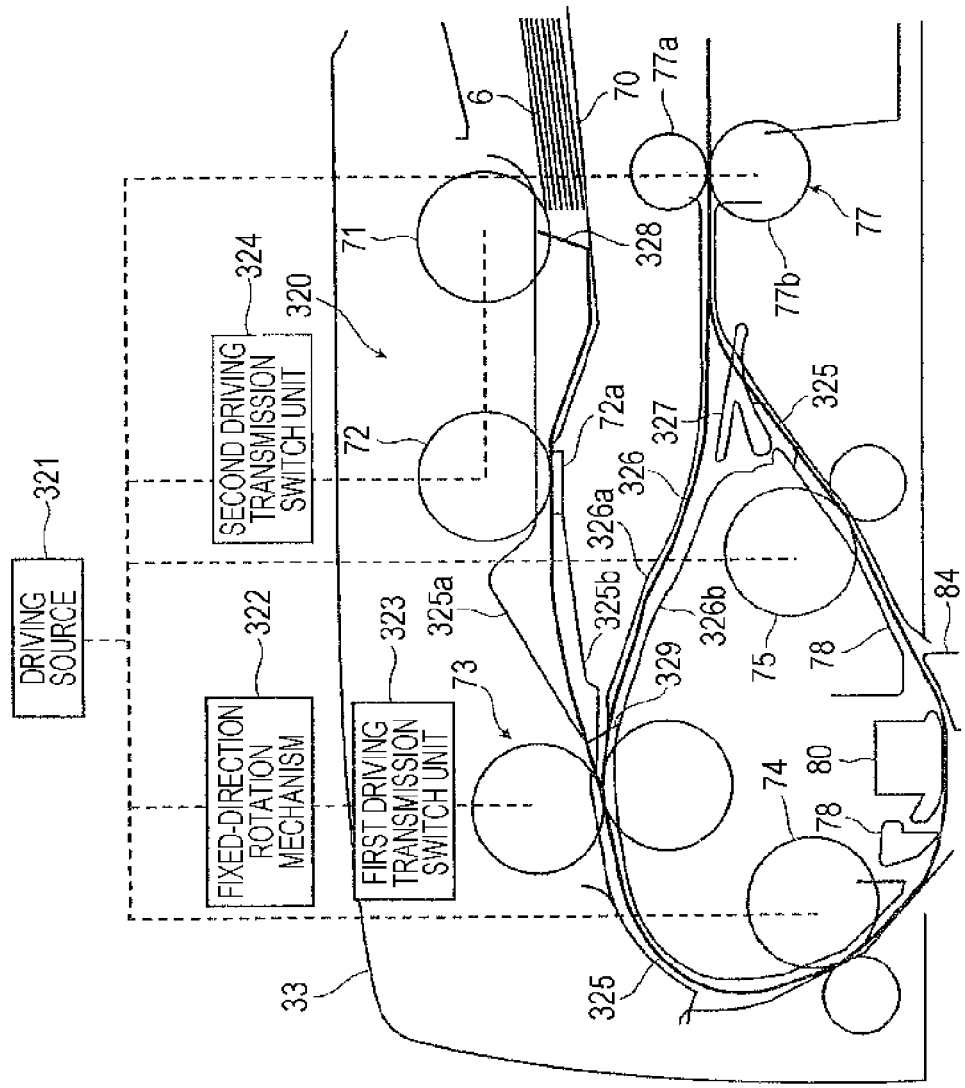
FIG. 3 is a structural view of the sheet transport device of the exemplary embodiment.

As illustrated in FIG. 3, the image reading device 3 according to the exemplary embodiment includes a sheet transport device 320 that loosens and transports documents 6 serving as an example of a sheet stored in the document storage unit 70 one by one to the reading position and that transports a document 6 having passed through the reading position to the reading position again in a state in which the document 6 is inverted by being switched back. The sheet transport device 320 includes the nudger roller 71, the feed roller 72, the pressure pad 72a, the first transport roller 73, the transport rollers 74 and 75, the output roller 77, a single driving motor 321, a fixed-direction rotation mechanism 322, a first driving transmission switch unit 323, and a second driving transmission switch unit 324. The driving motor 321 serves as an example of a driving unit (driving source) for driving these rollers. The fixed-direction rotation mechanism 322 serves as an example of a rotating unit that rotates the first transport roller 73 in a fixed direction regardless of the rotating direction of the driving motor 321. The first driving transmission switch unit 323 serves as an example of a switch unit that switches between states in which the driving force is transmitted to the first transport roller 73 and is not transmitted thereto. The second driving transmission switch unit 324 serves as an example of a switch unit that switches between states in which the driving force is transmitted to the feed roller 72 and the nudger roller 71 and is not transmitted thereto. In FIG. 3, broken lines show a transmission path of the driving force.

As illustrated in FIG. 3, the sheet transport device 320 includes a normal transport path 325 that transports the document 6 transported by the nudger roller 71 so that the document 6 passes through the feed roller 72, the first transport roller 73, the transport rollers 74 and 75, and the output roller 77, and an inverting transport path 326 that transports the document 6, which is held at a trailing edge by the output roller 77, to the first transport roller 73 again in a state in which the document 6 is inverted by reversing the rotating direction of the output roller 77. The normal transport path 325 includes plural guide members 325a and 325b divided along the normal transport path 325 to guide the front and back surfaces of the document 6, the reading guide 78, and the back-surface support member 80. The inverting transport path 326 includes guide members 326a and 326b that guide the front and back surfaces of the document 6. At a branch position where the normal transport path 325 and the inverting transport path 326 separate from each other, a switch gate 327 is provided to switch the transport path of the document 6 from the normal transport path 325 to the inverting transport path 326. For example, the switch gate 327 is formed by an elastically deformable synthetic resin film having a substantially Y-shaped cross section. As illustrated in FIG. 3, the switch gate 327 is usually disposed so that a part thereof obliquely crosses the normal transport path 325. When the document 6 is transported to the output roller 77 along the normal transport path 325, the switch gate 327 is pushed and elastically deformed by the document 6 to open the normal transport path 325 and to switch the transport direction of the document 6 toward the output roller 77. On the other hand, when the document 6 is transported to the first transport roller 73 along the inverting transport path 326 by reversing the rotating direction of the output roller 77 while the output roller 77 holds the trailing edge of the document 6, the switch gate 327 switches the transport path of the document 6 transported by the output roller 77 from the normal transport path 325 to the inverting transport path 326.

The sheet transport device 320 includes a document sensor 328 provided at a position corresponding to the nudger roller 71 to detect a leading edge of the document 6. The sheet transport device 320 further includes a pre-registration sensor 329 provided upstream of the first transport roller 73 in the transport direction of the document 6 to detect the leading edge of the document 6. The sheet transport device 320 still further includes an unillustrated registration sensor disposed downstream of the transport roller 74 in the transport direction of the document 6 to detect the leading edge of the document 6, and an unillustrated inverter sensor disposed upstream of the output roller 77 in the transport direction of the document 6 to detect a trailing edge of the document 6.

Figure 4:
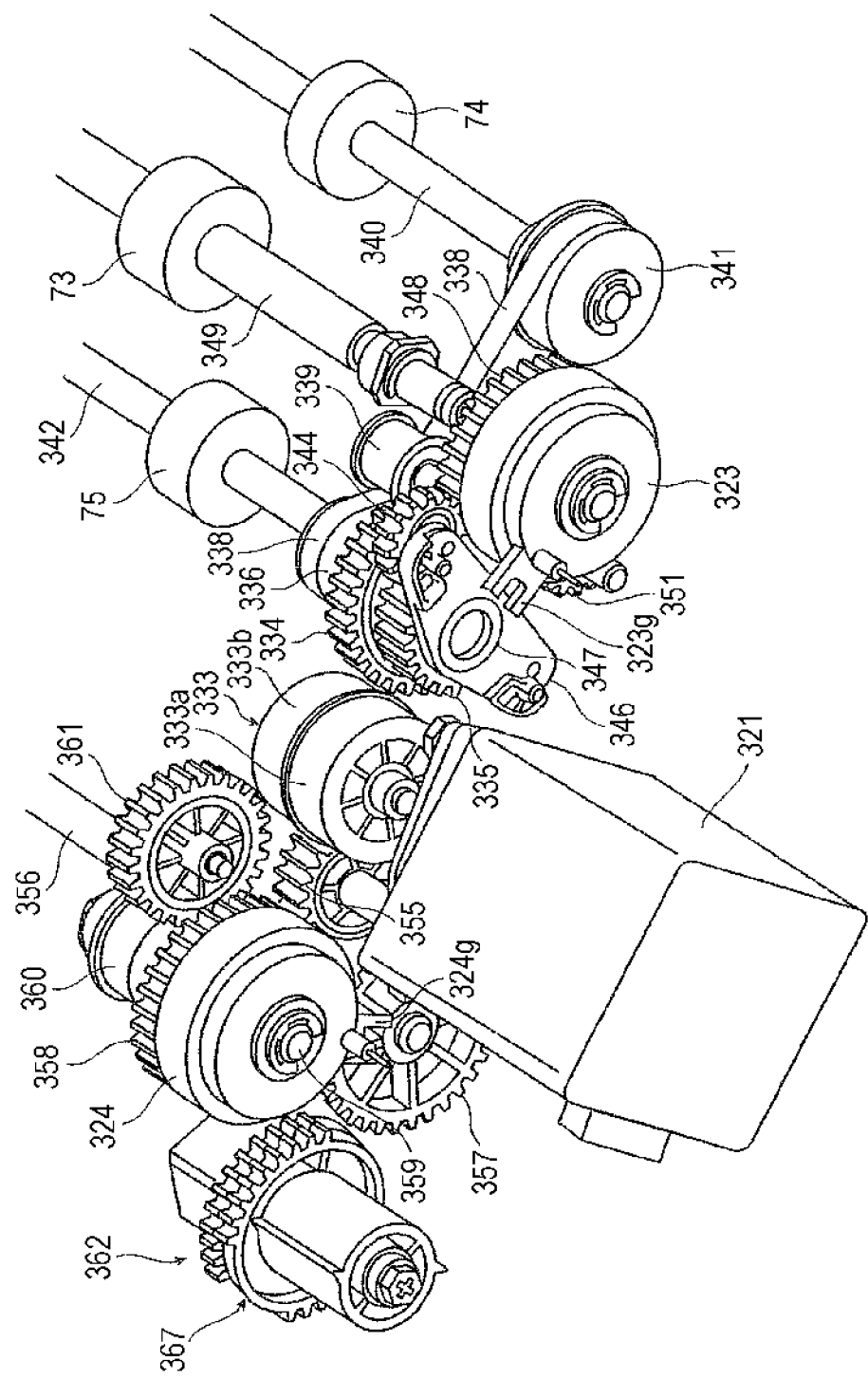
FIG. 4 is a structural perspective view of the sheet transport device of the exemplary embodiment.
Figure 5:
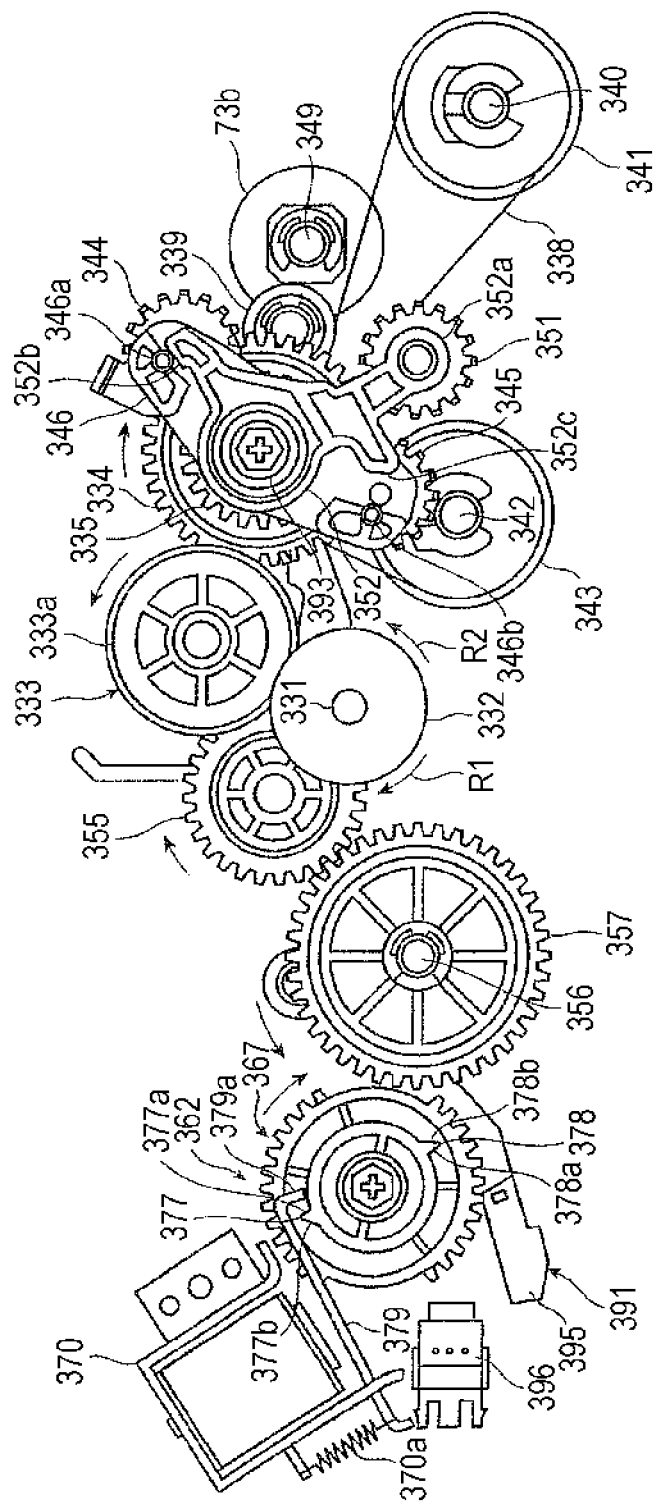
FIG. 5 is a structural front view of the sheet transport device of the exemplary embodiment.

The structure of the sheet transport device 320 will be described more specifically. As illustrated in FIGS. 4 and 5, the sheet transport device 320 includes a driving motor 321 serving as an example of a driving unit. The driving motor 321 is configured so that the rotating direction thereof can be switched between a first direction (forward direction) and a second direction (reverse direction). An output gear 332 is attached to an output shaft 331 of the driving motor 321 (see FIG. 5). The output gear 332 rotates in first and second directions R1 and R2 in accordance with the rotating direction of the driving motor 321. The output gear 332 is meshed with a first idler gear 333a of an integral double idler gear 333. A first driving gear 334 for rotating the first transport roller 73 and the transport rollers 74 and 75 is meshed with a second idler gear 333b of the double idler gear 333. A sun gear 335 is provided integrally with one axial side of the first driving gear 334, and a driving pulley 336 is provided integrally with the other axial side of the first driving gear 334.

Figure 6:
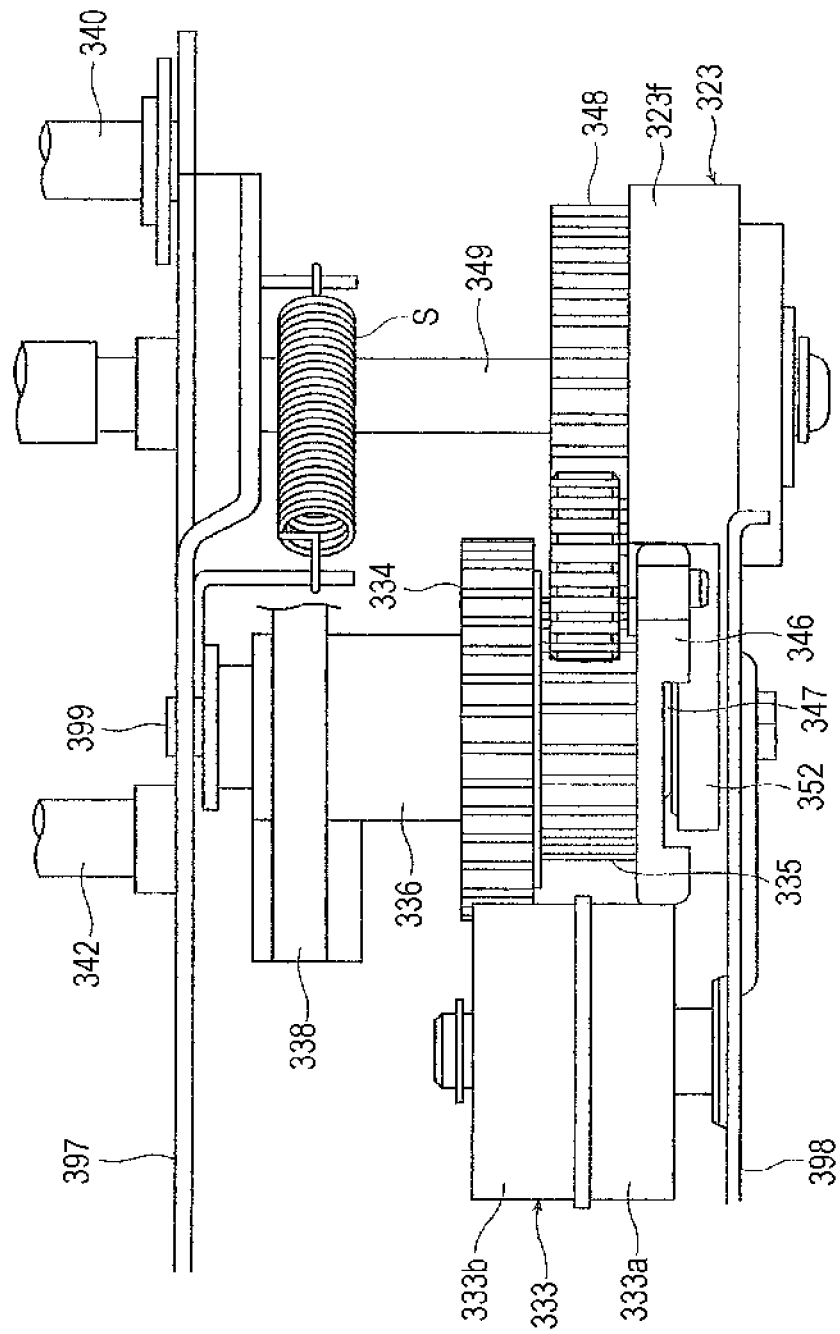
FIG. 6 is a structural plan view of the sheet transport device of the exemplary embodiment.

As illustrated in FIG. 6, the first driving gear 334, the sun gear 335, and the driving pulley 336 are rotatably attached to a support shaft 399 laid between first and second frames 397 and 398 of the sheet transport device 320. As illustrated in FIGS. 4 and 5, a driving belt 338 is wound on the driving pulley 336. Further, the driving belt 338 is stretched on a tension pulley 339 that applies tension to the driving belt 338, a driven pulley 341 attached to one end portion of a rotation shaft 340 of the transport roller 74, a driven pulley (not illustrated) that changes the stretching direction of the driving belt 338, and a driven pulley 343 (see FIG. 5) attached to one end portion of a rotation shaft 342 of the transport roller 75. Referring to FIG. 6, a coil spring S applies tension to the tension pulley 339.

Figure 7:
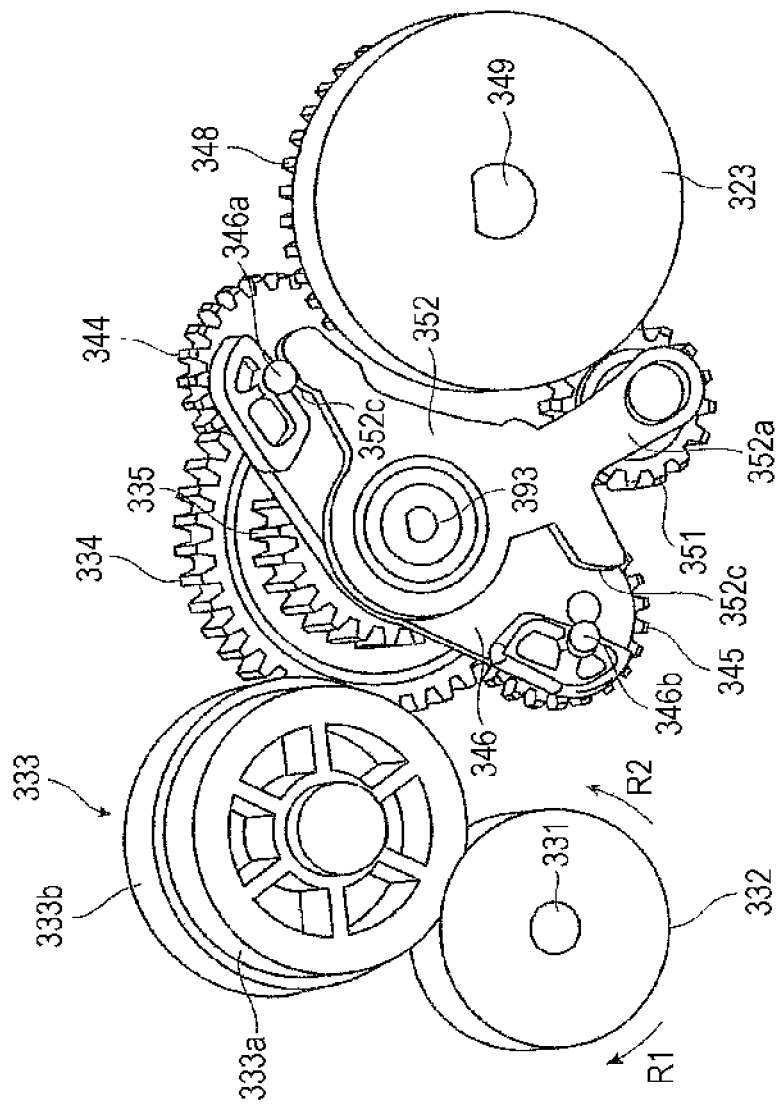
FIG. 7 is a structural perspective view illustrating the principal part of the sheet transport device of the exemplary embodiment.

As illustrated in FIGS. 5 and 7, first and second planet gears 344 and 345 having a diameter smaller than that of the sun gear 335 are meshed with the outer periphery of the sun gear 335. The first and second planet gears 344 and 345 are rotatably attached to distal end portions of a planet carrier 346 that is rotatably mounted on the support shaft 399 of the sun gear 335. The first and second planet gears 344 and 345 are arranged so that the center angle on the side of a one-direction gear 348 (to be described later) is smaller than 180 degrees. The planet carrier 346 is pressed against a side surface of the sun gear 335 with a required pressure by an annular leaf spring 347 having a curved side surface (see FIG. 4). The planet carrier 346 rotates in the same direction as the rotating direction of the sun gear 335 along with the rotation of the sun gear 335.

As illustrated in FIG. 4, a one-direction gear 348 serving as an example of a one-direction gear part to be selectively meshed with the first or second planet gear 344 or 345 is provided beside the sun gear 335. The one-direction gear 348 is rotatably mounted on a rotation shaft 349 of the first transport roller 73. When the sun gear 335 rotates in the forward direction (clockwise direction in FIG. 4), the one-direction gear 348 is rotated in the clockwise direction in FIG. 4 by being directly meshed with the first planet gear 344 attached to the planet carrier 346. Further, when the sun gear 335 rotates in the reverse direction (counterclockwise direction in FIG. 4), the one-direction gear 348 is similarly rotated in the clockwise direction by being meshed with the second planet gear 345 attached to the planet carrier 346 with an intermediate gear 351 being disposed therebetween. In this way, the one-direction gear 348 constantly rotates in the fixed direction (clockwise direction in FIG. 4), regardless of the rotating direction of the driving motor 321 for driving the sun gear 335 in the forward direction and the reverse direction. The sun gear 335, the first and second planet gears 344 and 345, the intermediate gear 351, and the one-direction gear 348 constitute a fixed-direction rotation mechanism 322.

As illustrated in FIGS. 5 and 7, the intermediate gear 351 is rotatably attached to a distal end 352a of an arm member 352. The intermediate gear 351 is constantly meshed with the one-direction gear 348. The arm member 352 is attached to the support shaft 399 in a fixed state. As illustrated in FIG. 6, the arm member 352 is disposed between the second frame 398 and the planet carrier 346. As described above, the planet carrier 346 is pressed against the side surface of the sun gear 335 by the annular leaf spring 347 interposed between the planet carrier 346 and the arm member 352. As illustrated in FIGS. 5 and 7, columnar projections 346a and 346b provided on the planet carrier 346 are in contact with side surfaces 352b and 352c of a support portion that rotatably supports the first and second planet gears 344 and 345 in the arm member 352. Thus, the planet carrier 346 that rotates together with the sun gear 335 is positioned. The intermediate gear 351 is coaxially provided with a driven pulley (not illustrated) that changes the stretching direction of the driving belt 338. The intermediate gear 351 serves to transmit the rotation to the one-direction gear 348 by reversing the rotating direction of the second planet gear 345. The intermediate gear 351 does not always need to be a single gear, and may be composed of an odd number of intermediate gears meshed with one another.

In the exemplary embodiment, the same gears are used as the first and second planet gears 344 and 345 and the intermediate gear 351 in order to use parts in common.

Figure 8:
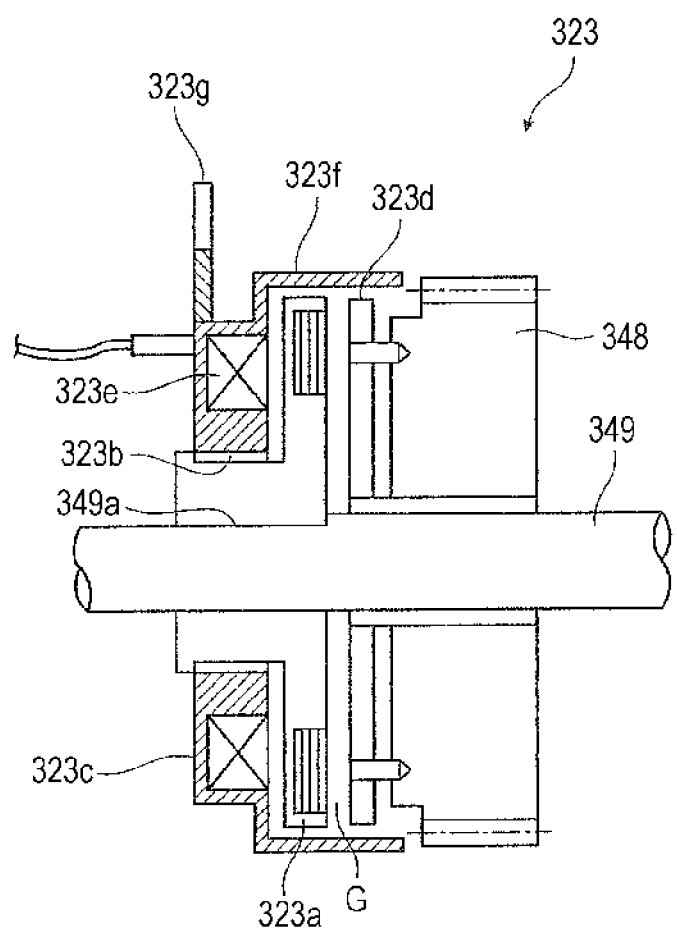
FIG. 8 is a cross-sectional structural view of an electromagnetic clutch.

As illustrated in FIG. 4, the one-direction gear 348 is attached to a first electromagnetic clutch 323 serving as an example of a first driving transmission switch unit. As illustrated in FIG. 8, the first electromagnetic clutch 323 includes a rotor 323a, a stator 323c, an armature 323d, an excitation coil 323e, and a cylindrical exterior 323f. The rotor 323a is fixed to the rotation shaft 349 of the first transport roller 73 with a D-cut surface 349a provided on the rotation shaft 349 being disposed therebetween. The stator 323c is fixed to the rotor 323a with a bearing 323b being disposed therebetween. The armature 323d is rotatably attached to the rotation shaft 349 and is formed by a moving piece to which the one-direction gear 348 is fixed. The excitation coil 323e is provided in the stator 323c to form a magnetic circuit that penetrates in the axial direction of the rotor 323a. The exterior 323f also functions as a yoke, and protects the excitation coil 323e. The exterior 323f is disposed next to the one-direction gear 348. The outer diameter of the exterior 323f is set to be larger than that of the one-direction gear 348. The exterior 323f may be provided integrally with the stator 323c. The stator 323c is fixed to the second frame 398 of the sheet transport device 320 with a whirl stop portion 323g being disposed therebetween. The armature 323d has an unillustrated separating spring that biases the armature 323d in a direction to separate from the rotor 323a. This forms a gap G between a vertical surface of the armature 323d and a side surface of the rotor 323a.

In the first electromagnetic clutch 323, the armature 323d and the rotor 323a are coupled against the separating spring by supplying power to the excitation coil 323e, and the rotation driving force of the armature 323d, which is rotated by the one-direction gear 348, is transmitted to the rotor 323a to rotate the rotation shaft 349 to which the rotor 323a is fixed.

On the other hand, in the first electromagnetic clutch 323, the armature 323d is separated from the rotor 323a by elastic force of the separating spring by stopping the supply of power to the excitation coil 323e, the rotation driving force of the armature 323d is not transmitted to the rotor 323a, and the rotation shaft 349 to which the rotor 323a is fixed is stopped. At this time, the armature 323d to which the one-direction gear 348 is attached continues rotation together with the one-direction gear 348.

As illustrated in FIG. 5, a second driving gear 355 for rotating the nudger roller 71, the feed roller 72, and the output roller 77 is meshed with the second idler gear 333b of the double idler gear 333. The second driving gear 355 is meshed with a driven gear 357 attached to an end portion of a rotation shaft 356 of the output roller 77. Further, as illustrated in FIG. 4, a transmission gear 358 for transmitting the rotation driving force to the nudger roller 71 and the feed roller 72 is meshed with the driven gear 357. To a rotation shaft 359 of the transmission gear 358, a second electromagnetic clutch 324 is attached as an example of a second driving transmission switch unit. The second electromagnetic clutch 324 has a structure similar to that of the first electromagnetic clutch 323. Referring to FIG. 4, the second electromagnetic clutch 324 has a whirl stop portion 324g.

As illustrated in FIG. 4, a driven gear 360 is fixed to the rotation shaft 359 of the transmission gear 358. A transmission gear 361 for transmitting the rotation driving force to the feed roller 72 and the nudger roller 71 is also meshed with the driven gear 360. As will be described later, a driven gear 421 (see FIG. 13) attached to an end portion of a driving shaft 413 of the feed roller 72 is meshed with the transmission gear 361.

In the exemplary embodiment, as illustrated in FIG. 5, a release unit 362 is provided to release the transport force of the output roller 77 for the document 6 at a preset timing when the rotating direction of the driving motor 321 is switched to the forward direction after the output roller 77 transports the document 6 to the first transport roller 73 by switching back the document 6.

Figure 9:
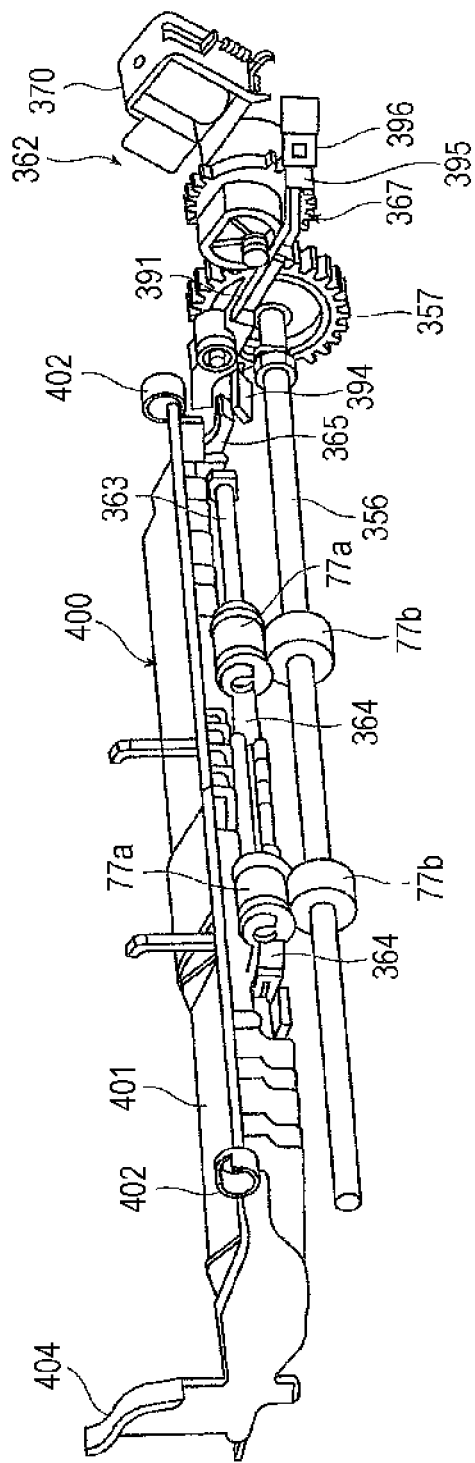
FIG. 9 is a structural perspective view of an output roller.

As illustrated in FIG. 3, the release unit 362 is configurated to separate upper driven rollers 77a, of the output roller 77 composed of a pair of rollers in pressure contact with each other, from lower driving rollers 77b. As illustrated in FIG. 9, the driven rollers 77a of the output roller 77 are rotatably attached to distal ends of arms 364 extending from a support shaft 363 rotatably supported by the sheet transport device 32 in an intersecting direction. A lift arm 365 for lifting the driven rollers 77a in a direction to separate from the driving rollers 77b is provided integrally with one end portion of the support shaft 363 in a direction intersecting the support shaft 363. As illustrated in FIG. 9, the lift arm 365 is moved up and down by intermittent transmission of driving force from the driven gear 357. The arms 364 of the support shaft 363 are biased in a direction to press the driven rollers 77a against the driving rollers 77b. FIG. 9 further illustrates an opening and closing unit 400 in the sheet transport device 320, an opening and closing member 401, pivot points 402 of the opening and closing member 401, and an operating unit 404 used to open and close the opening and closing member 401.

Figure 10:
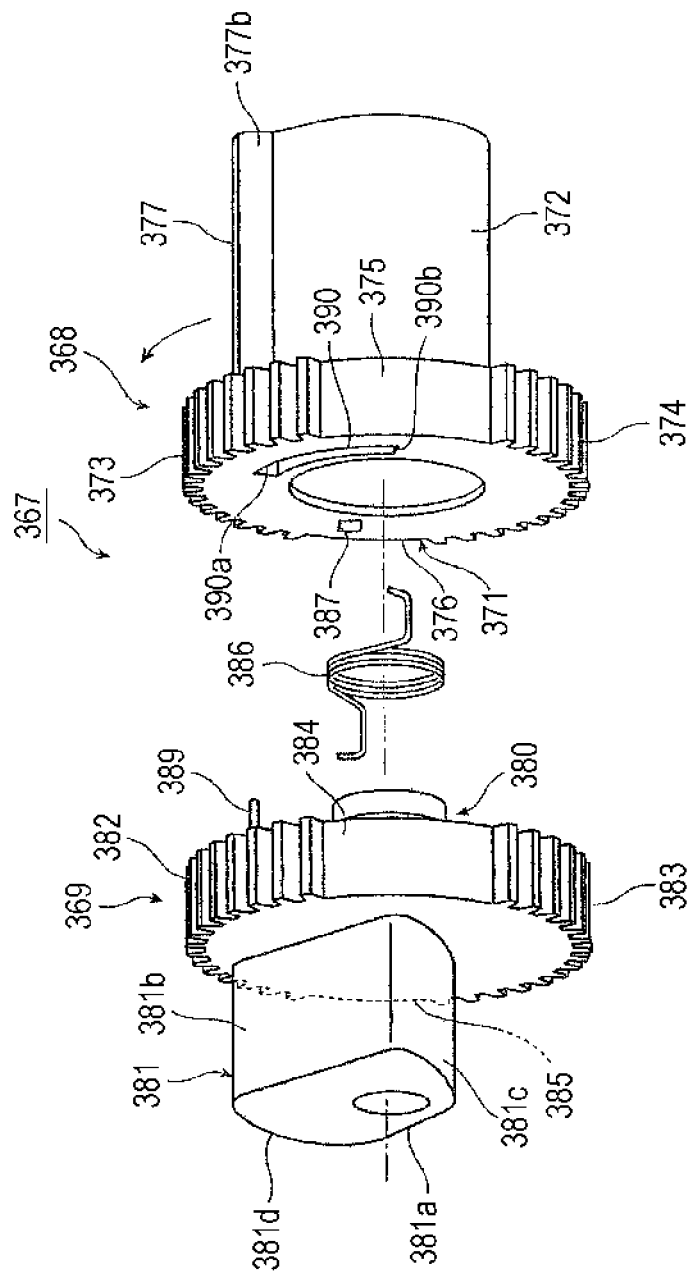
FIG. 10 is a structural perspective view illustrating an exploded state of a tooth-lacking gear.

As illustrated in FIGS. 4 and 5, a tooth-lacking gear 367 in which teeth are not provided in a part thereof in the circumferential direction is disposed on one side of the driven gear 357. As illustrated in FIG. 10, the tooth-lacking gear 367 is formed by coaxially combining a first tooth-lacking gear 368 and a second tooth-lacking gear 369. As illustrated in FIG. 5, a solenoid 370 is disposed on one side of the tooth-lacking gear 367 to intermittently drive the tooth-lacking gear 367.

As illustrated in FIG. 10, the first tooth-lacking gear 368 includes a cylindrical large-diameter portion 371 having a relatively large outer diameter, and a small-diameter portion 372 provided integrally with one axial end of the large-diameter portion 371 and shaped like a hollow cylinder having an outer diameter relatively smaller than that of the large-diameter portion 371. On the outer periphery of the large-diameter portion 371, a first gear portion 373 and a second gear portion 374 that form a center angle smaller than 180 degrees are provided at positions symmetrical with respect to the center of the axis. Between the first gear portion 373 and the second gear portion 374, a first tooth-lacking portion 375 and a second tooth-lacking portion 376 are provided so that teeth are not formed therein. On the outer periphery of the small-diameter portion 372, two engaging portions 377 and 378 are provided at positions spaced 180 degrees apart. As illustrated in FIG. 5, the engaging portions 377 and 378 respectively include engaging surfaces 377a and 378a provided in the radial direction and inclined surfaces 377b and 378b inclined from distal ends of the engaging surfaces 377a and 378a to one side in the circumferential direction. When the solenoid 370 is in an off state, a distal end 379a of an operating lever 379 biased by a spring 370a engages with the engaging portion 377 or 378 of the small-diameter portion 372.

In contrast, as illustrated in FIG. 10, the second tooth-lacking gear 369 includes a cylindrical large-diameter portion 380 having a relatively large outer diameter, and a cam portion 381 provided integrally with one axial end of the large-diameter portion 380. Similarly to the first tooth-lacking gear 368, on the outer periphery of the large-diameter portion 380, a third gear portion 382 and a fourth gear portion 383 that form a center angle smaller than 180 degrees are provided at positions symmetrical with respect to the center of the axis. Between the third gear portion 382 and the fourth gear portion 383, a third tooth-lacking portion 384 and a fourth tooth-lacking portion 385 are provided. The third and fourth gear portions 382 and 383 and the third and fourth tooth-lacking portions 384 and 385 are structured similarly to the first and second gear portions 373 and 374 and the first and second tooth-lacking portions 375 and 376, respectively.

The cam portion 381 includes a first flat portion 381a shaped like a flat surface at a position near the rotation axis, a second flat portion 381b shaped like a flat surface at a position farther from the rotation axis than the first flat portion 381a, and curved portions 381c and 381d that connect the first and second flat portions 381a and 381b.

Between the first tooth-lacking gear 368 and the second tooth-lacking gear 369, a coil spring 386 is provided as an example of a rotation-force applying unit that applies rotation force for rotating the first tooth-lacking gear 368 relative to the second tooth-lacking gear 369 in the clockwise direction in FIG. 5. One end of the coil spring 386 is inserted in an insertion hole 387 of the first tooth-lacking gear 368. The other end of the coil spring 386 is inserted in an insertion hole 388 of the second tooth-lacking gear 369 (see FIG. 11).

A pin 389 serving as a guided member is provided on a side surface of the second tooth-lacking gear 369 facing the first tooth-lacking gear 368. On the other hand, a guide groove 390 serving as an example of a guide portion is provided in the first tooth-lacking gear 368 in correspondence with the pin 389. The guide groove 390 is arc-shaped to form a required center angle at a required position around the axis. In a state in which the first tooth-lacking gear 368 and the second tooth-lacking gear 369 are combined, the coil spring 386 applies rotation force for rotating the first tooth-lacking gear 368 relative to the second tooth-lacking gear 369 in the clockwise direction in FIG. 5. In the state of FIG. 5, the pin 389 is located in one end portion 390a of the guide groove 390.

As illustrated in FIG. 9, a distal end portion 392 of an operating member 391 is disposed to be constantly held in pressure contact with the cam portion 381 of the second tooth-lacking gear 369 by elastic force of an unillustrated coil spring or the like. The operating member 391 is turnably attached to the first frame 397 with a support shaft 393 provided at its base end portion being disposed therebetween. An operating portion 394 for moving the lift arm 365 up and down protrudes from a side surface of the base end portion of the operating member 391 in the axial direction of the support shaft 393. At a distal end of the operating member 391, a planar detector 395 is provided to detect the position of the operating member 391 with a position sensor 396.

Figure 11A:
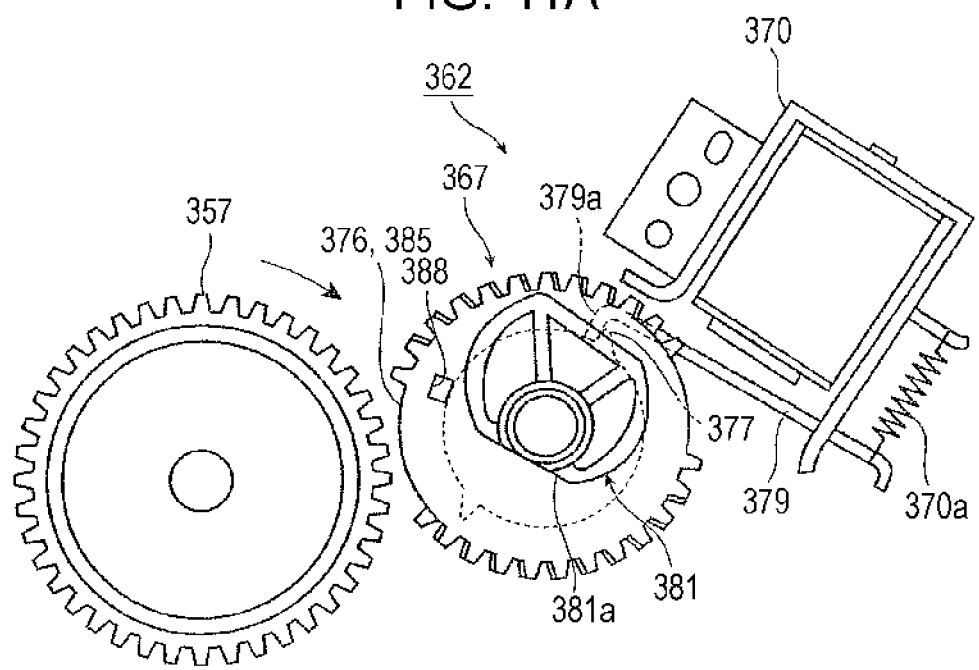
FIG. 11A is a structural view illustrating a state in which one engaging portion of the tooth-lacking gear is engaged with a distal end portion of a solenoid.

As illustrated in FIG. 11A, in the release unit 362, the solenoid 370 is usually in an off state, and the operating lever 379 is engaged with one engaging portion 377 of the tooth-lacking gear 367. At this time, the tooth-lacking gear 367 is stopped at a position where the second and fourth tooth-lacking portions 376 and 385 are opposed to the driven gear 357. For this reason, the rotation driving force of the driven gear 357 is not transmitted to the tooth-lacking gear 367. The first flat portion 381a of the cam portion 381 in the tooth-lacking gear 367 is in contact with the distal end portion 392 of the operating member 391. Hence, the operating member 391 is located at a position of FIG. 9. For this reason, the operating portion 394 of the operating member 391 is located in a lower position, the lift arm 365 is pushed down, and the driven rollers 77a of the output roller 77 are in contact with the driving rollers 77b.

Figure 11B:
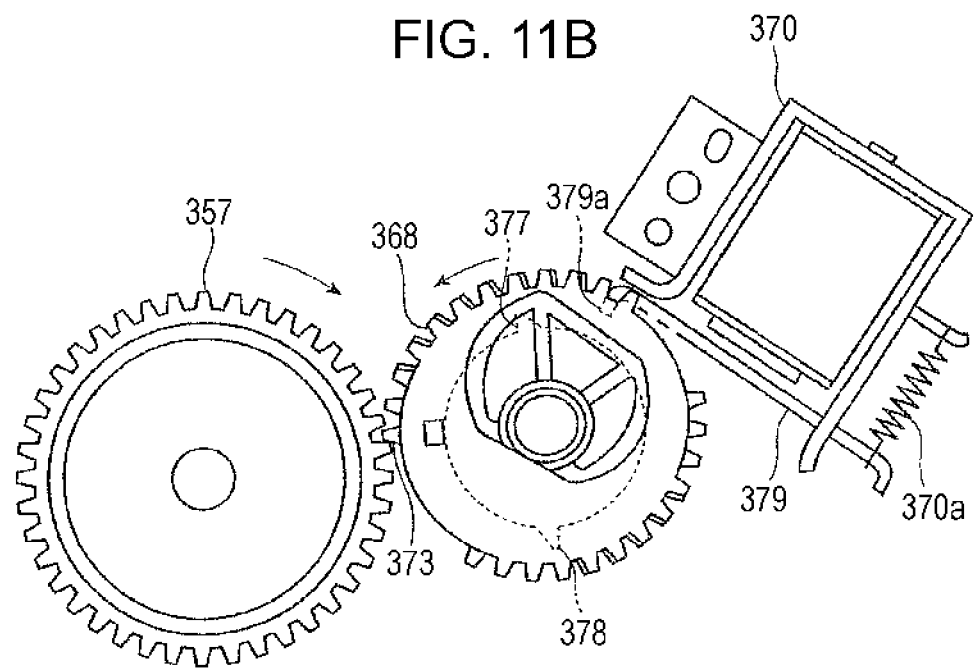
FIG. 11B is a structural view illustrating a state in which the engaging portion of the tooth-lacking gear is disengaged from the distal end portion of the solenoid.

Next, as illustrated in FIG. 11B, in the release unit 362, when the solenoid 370 is made in an on state only in a preset short time, the engaged state between the distal end 379a of the operating lever 379 and the engaging portion 377 of the tooth-lacking gear 367 is released. Then, the first tooth-lacking gear 368 of the tooth-lacking gear 367 is turned by the elastic force of the coil spring 386, and the first gear portion 373 of the first tooth-lacking gear 368 is meshed with the driven gear 357. For this reason, the first tooth-lacking gear 368 is rotated in the counterclockwise direction in FIG. 11B by the driven gear 357. At this time, the second tooth-lacking gear 369 is stopped. When the first tooth-lacking gear 368 rotates a required angle or more in the counterclockwise direction in FIG. 11B, the pin 389 of the second tooth-lacking gear 369 comes into contact with an end portion 390b of the guide groove 390 in the first tooth-lacking gear 368, as illustrated in FIG. 10. As a result, the second tooth-lacking gear 369 is rotated in the same direction a required angle behind the first tooth-lacking gear 368, and the third gear portion 382 is meshed with the driven gear 357.

Figure 12A:
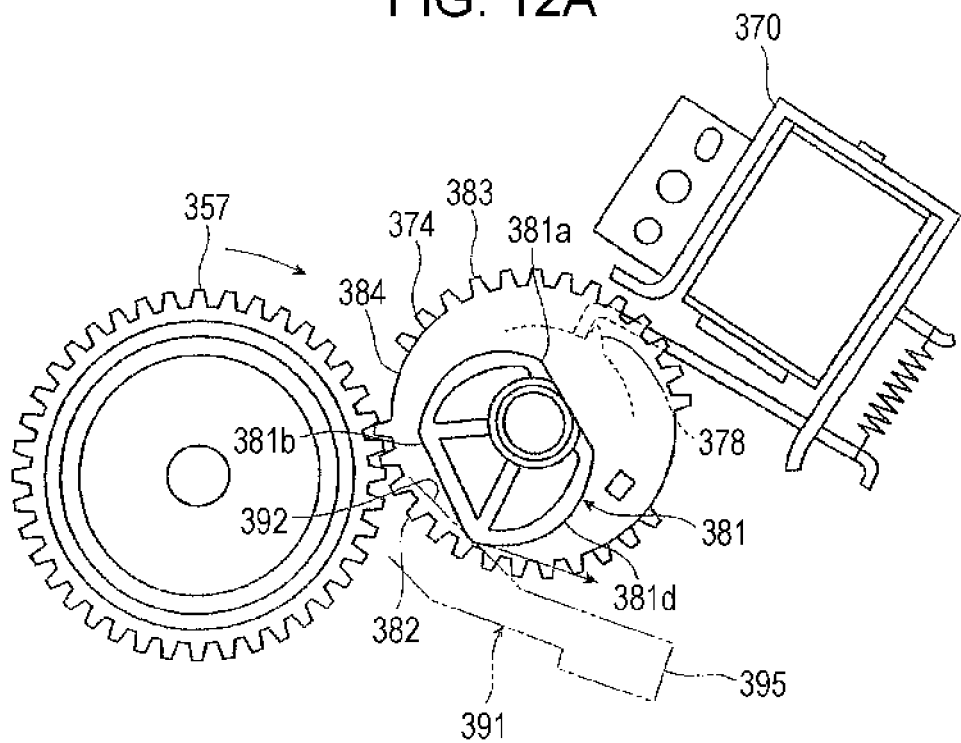
FIG. 12A is a structural view illustrating an intermediate state in which a cam portion of the tooth-lacking gear rotates.
Figure 12B:
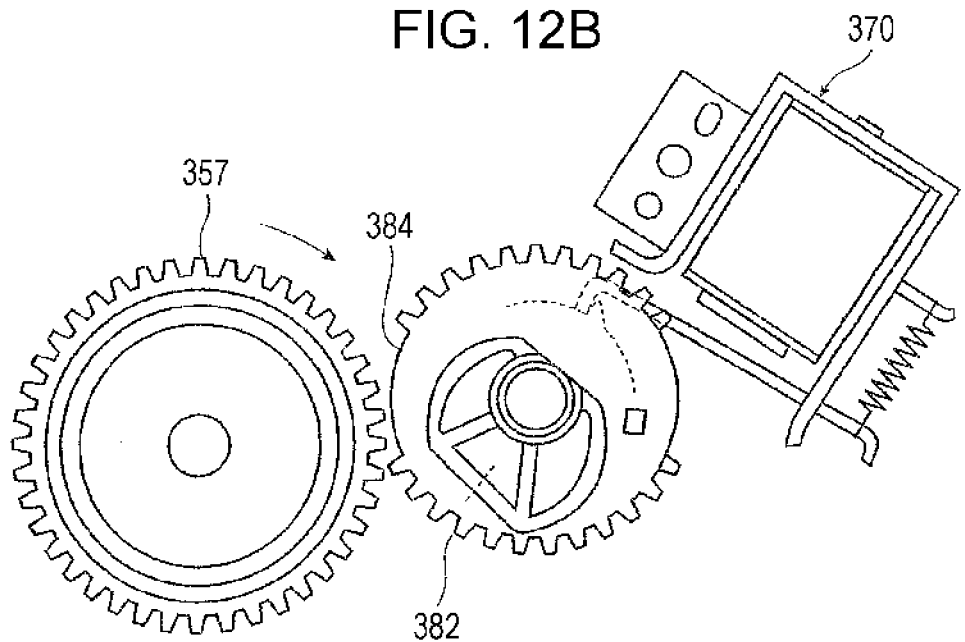
FIG. 12B is a structural view illustrating a state in which the cam portion of the tooth-lacking gear is stopped.

When the first tooth-lacking gear 368 rotates to a position where engagement of the first gear portion 373 and the driven gear 357 is finished and the first tooth-lacking portion 375 is opposed to the driven gear 357, as illustrated in FIG. 12A, the rotation driving force is not transmitted from the driven gear 357. However, the elastic force in the clockwise direction in FIG. 5 is applied from the coil spring 386 to the first tooth-lacking gear 368. For this reason, the first tooth-lacking gear 368 continues the rotation in the clockwise direction in FIG. 5, and is stopped in a state in which the other engaging portion 378 is engaged with the distal end 379a of the operating lever 379 in the solenoid 370, as illustrated in FIG. 12B.

In contrast, as described above, the second tooth-lacking gear 369 rotates in the same direction as the first tooth-lacking gear 368 the required angle behind the first tooth-lacking gear 368. For this reason, at the time when the second tooth-lacking gear 369 rotates to a position where the first tooth-lacking portion 375 of the first tooth-lacking gear 368 is opposed to the driven gear 357, it continues the rotation while the third gear portion 382 is still meshed with the driven gear 357.

After that, as illustrated in FIG. 12A, the second tooth-lacking gear 369 rotates to a position where the engagement between the third gear portion 382 and the driven gear 357 is finished and the third tooth-lacking portion 384 is opposed to the driven gear 357. Then, the rotation driving force is not transmitted from the driven gear 357 to the second tooth-lacking gear 369. At this time, the cam portion 381 of the second tooth-lacking gear 369 is set to be brought into pressure contact with the distal end portion 392 of the operating member 391 between the curved portion 381d and the second flat portion 382b after passing through a dead center where the eccentricity amount of the cam portion 381 is the largest. For this reason, at the time when engagement of the third gear portion 382 and the driven gear 357 is finished, rotational moment for rotating the second tooth-lacking gear 369 in the counterclockwise direction in FIG. 12A is applied to the second tooth-lacking gear 369 by the pressing force between the second flat portion 382b of the cam portion 381 and the distal end portion 392 of the operating member 391. As a result, as illustrated in FIG. 12B, the second tooth-lacking gear 369 rotates and stops at a position where the entire surface of the second flat portion 381b of the cam portion 381 is in pressure contact with the distal end portion 392 of the operating member 391.

At this time, the distal end portion 392 of the operating member 391 is pushed down by the cam portion 381 of the second tooth-lacking gear 369. In FIG. 9, the operating member 391 is at a position where it is rotated in the clockwise direction. For this reason, the operating portion 394 of the operating member 391 turns upward and pushes up the lift arm 365. The support shaft 363 provided with the lift arm 365 rotates in the counterclockwise direction in FIG. 9. Therefore, the driven rollers 77a of the output roller 77 move to a position separate from the driving rollers 77b.

In the tooth-lacking gear 367, the first tooth-lacking gear 368 first stops, and the second tooth-lacking gear 369 rotates in the same direction as the first tooth-lacking gear 368 after some delay and stops. In the meantime, the coil spring 386 is tightened by the second tooth-lacking gear 369 that rotates relative to the stopped first tooth-lacking gear 368.

After that, the tooth-lacking gear 367 is rotated 180 degrees by bringing the solenoid 370 into an on state only for a preset time and returns to the state of FIG. 11A, and the driven rollers 77a of the output roller 77 come into contact with the driving rollers 77b.

In this way, in the release unit 362, the operating member 391 is turned by turning the solenoid 370 on and off, the driven rollers 77a of the output roller 77 are separated from the driving rollers 77b, and the state in which the transport force of the output roller 77 acts on the document 6 is released.

Figure 13:
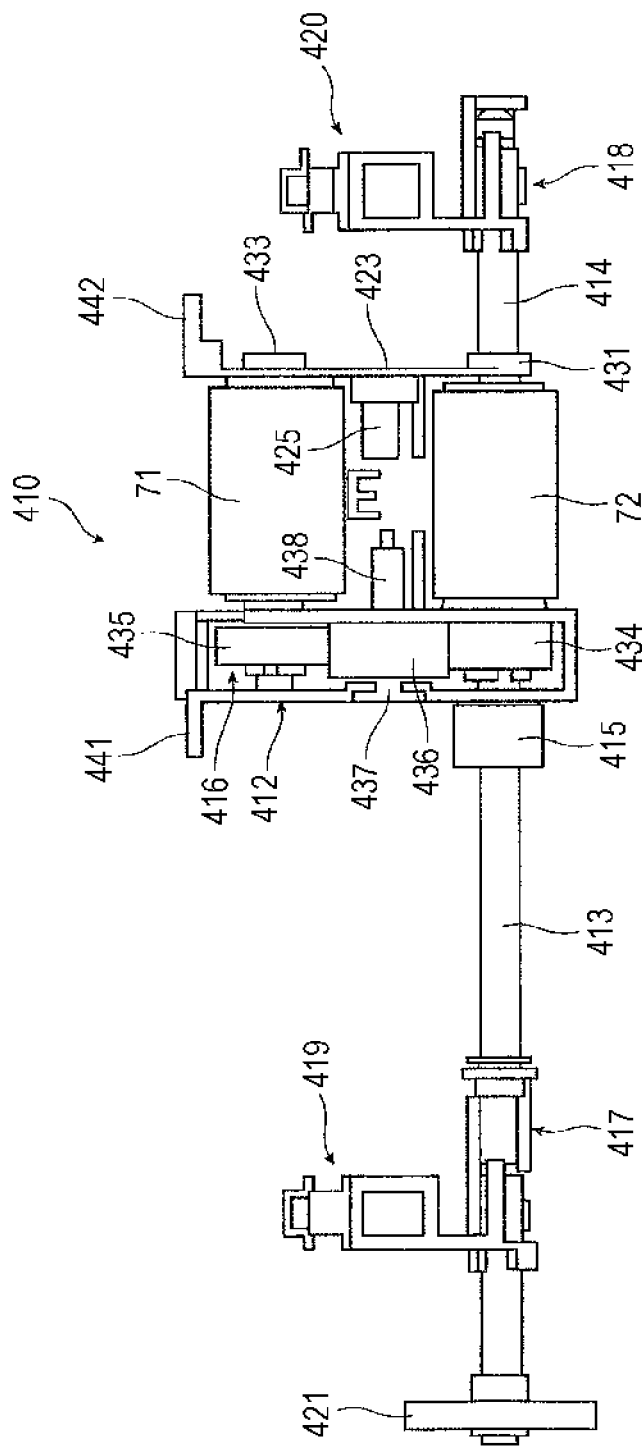
FIG. 13 is a structural plan view of a feeding unit.
Figure 14:
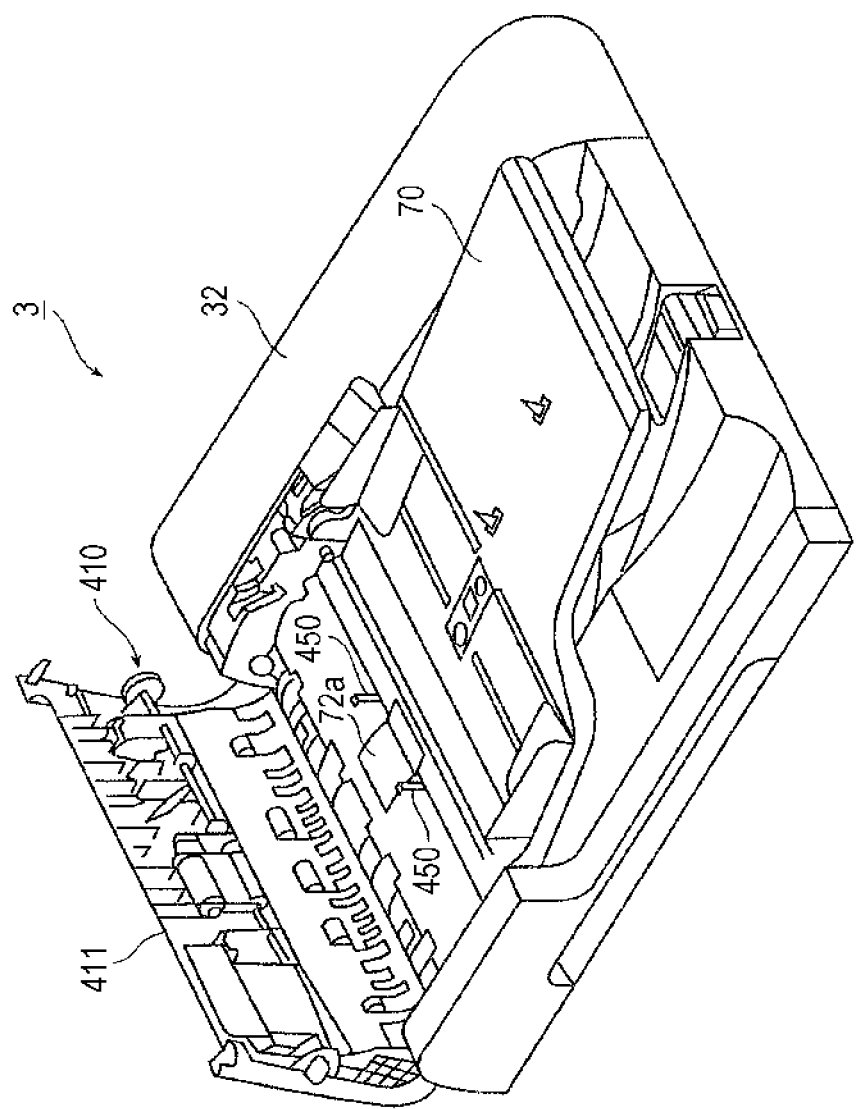
FIG. 14 is a structural perspective view illustrating a state in which a side covering of the image reading device is open.
Figure 15:
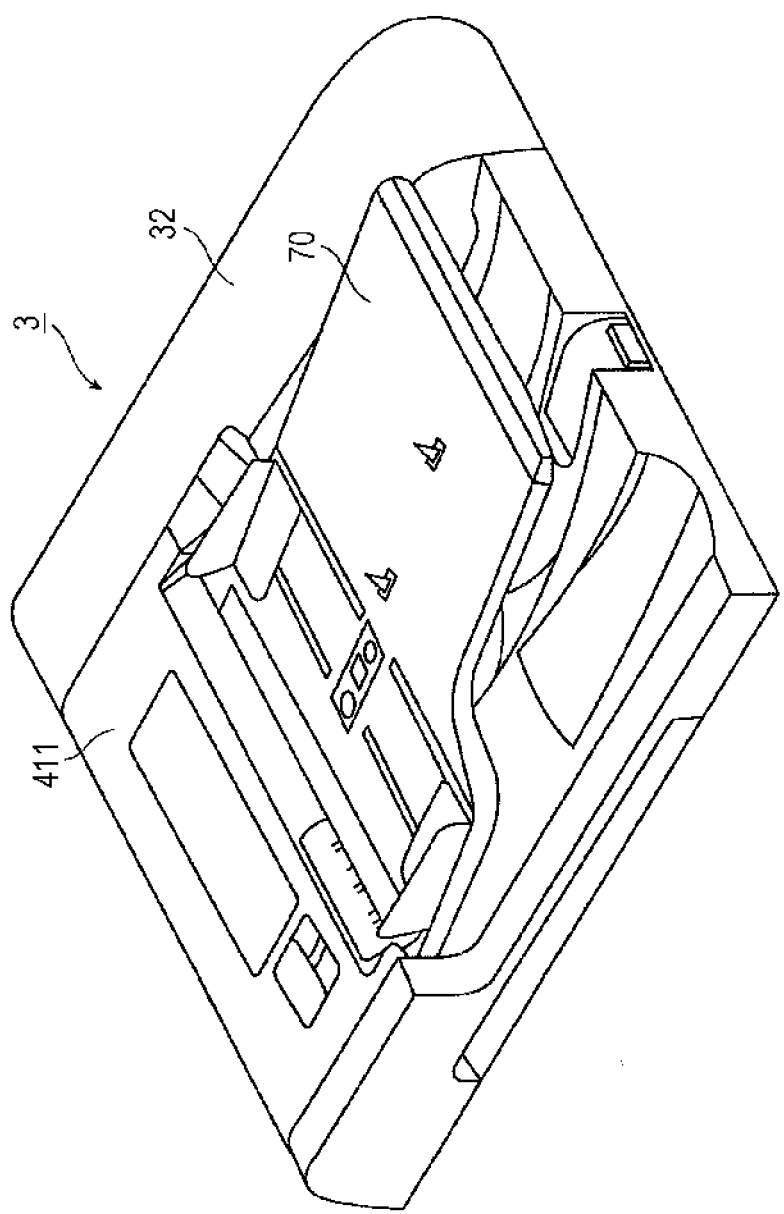
FIG. 15 is a structural perspective view illustrating a state in which the side covering of the image reading device is closed.
Figure 16:
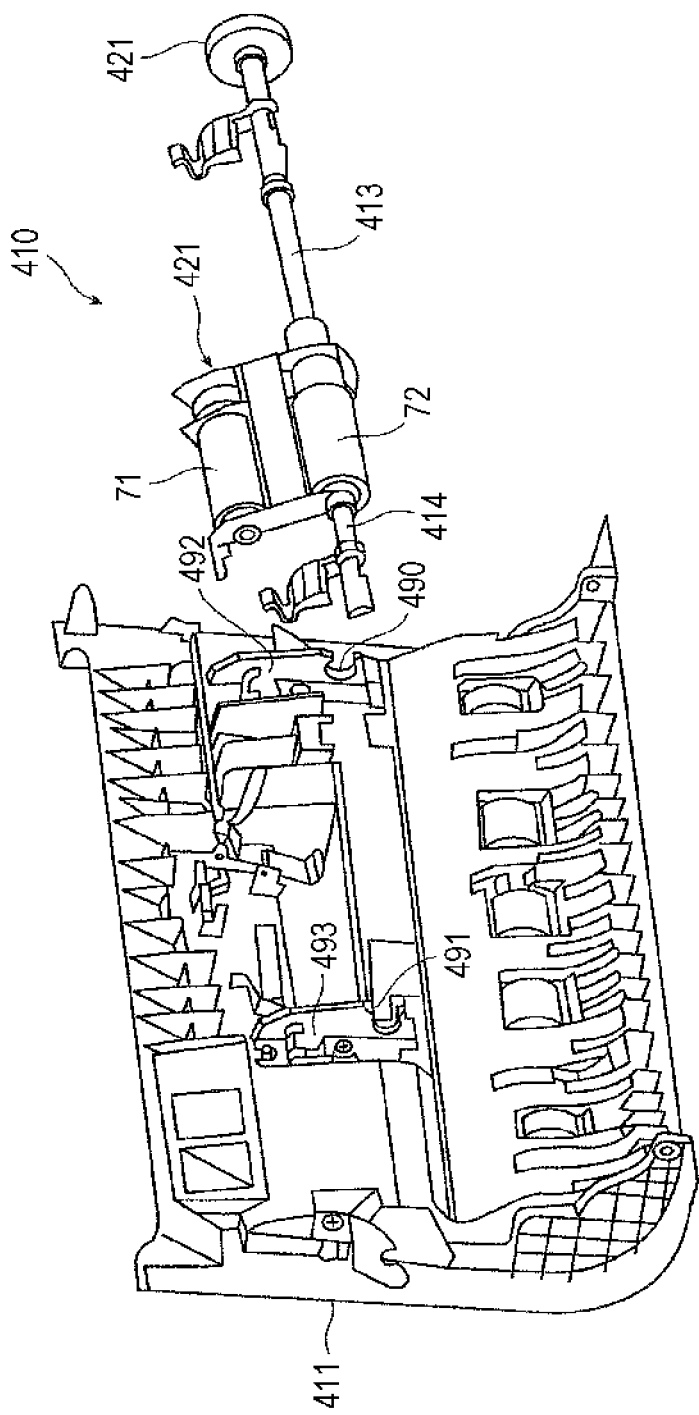
FIG. 16 is a structural perspective view illustrating a state in which the feeding unit is detached from the side covering.

As illustrated in FIG. 13, the sheet transport device 320 of the exemplary embodiment includes a feeding unit 410 serving as an example of a feeding unit in which a nudger roller 71 and a feed roller 72 are assembled integrally. As illustrated in FIGS. 14 to 16, the feeding unit 410 is removably attached to a side covering 411 serving as an example of an opening and closing member of the image reading device 3. The side covering 411 is attached to the document press covering 32 of the image reading device 3 to be openable and closable about a lower portion of one end portion (a left end portion in FIG. 14).

As illustrated in FIG. 13, the feeding unit 410 includes the nudger roller 71, the feed roller 72, a holding frame 412, a first driving shaft 413, a second driving shaft 414, a torque limiter 415, a driving-force transmission unit 416, plural (two) bearing members 417 and 418, first and second fixing members 419 and 420, and a driven gear 421. The holding frame 412 serves as an example of a holding member that holds the nudger roller 71 and the feed roller 72. The first driving shaft 413 serves as an example of a driving shaft that transmits the rotation driving force to the nudger roller 71 and the feed roller 72 to rotate the nudger roller 71 and the feed roller 72. The second driving shaft 414 rotates the feed roller 72. The torque limiter 415 is interposed between the first driving shaft 413 and the second driving shaft 414. The driving-force transmission unit 416 transmits the rotation driving force of the second driving shaft 414 to the nudger roller 71. The bearing members 417 and 418 support the first and second driving shafts 413 and 414 rotatably. The first and second fixing members 419 and 420 are provided integrally with the bearing members 417 and 418, respectively, to removably fix the bearing members 417 and 418 to an inner surface of the side covering 411. The driven gear 421 is attached to an end portion of the first driving shaft 413. The rotation driving force is transmitted to the driven gear 421 when the driven gear 421 is meshed with the transmission gear 361 (see FIG. 4) on the side of the document press covering 32 in a state in which the side covering 411 to which the feeding unit 410 is attached is closed relative to the document press covering 32, as illustrated in FIGS. 14 and 15.

Figure 17:
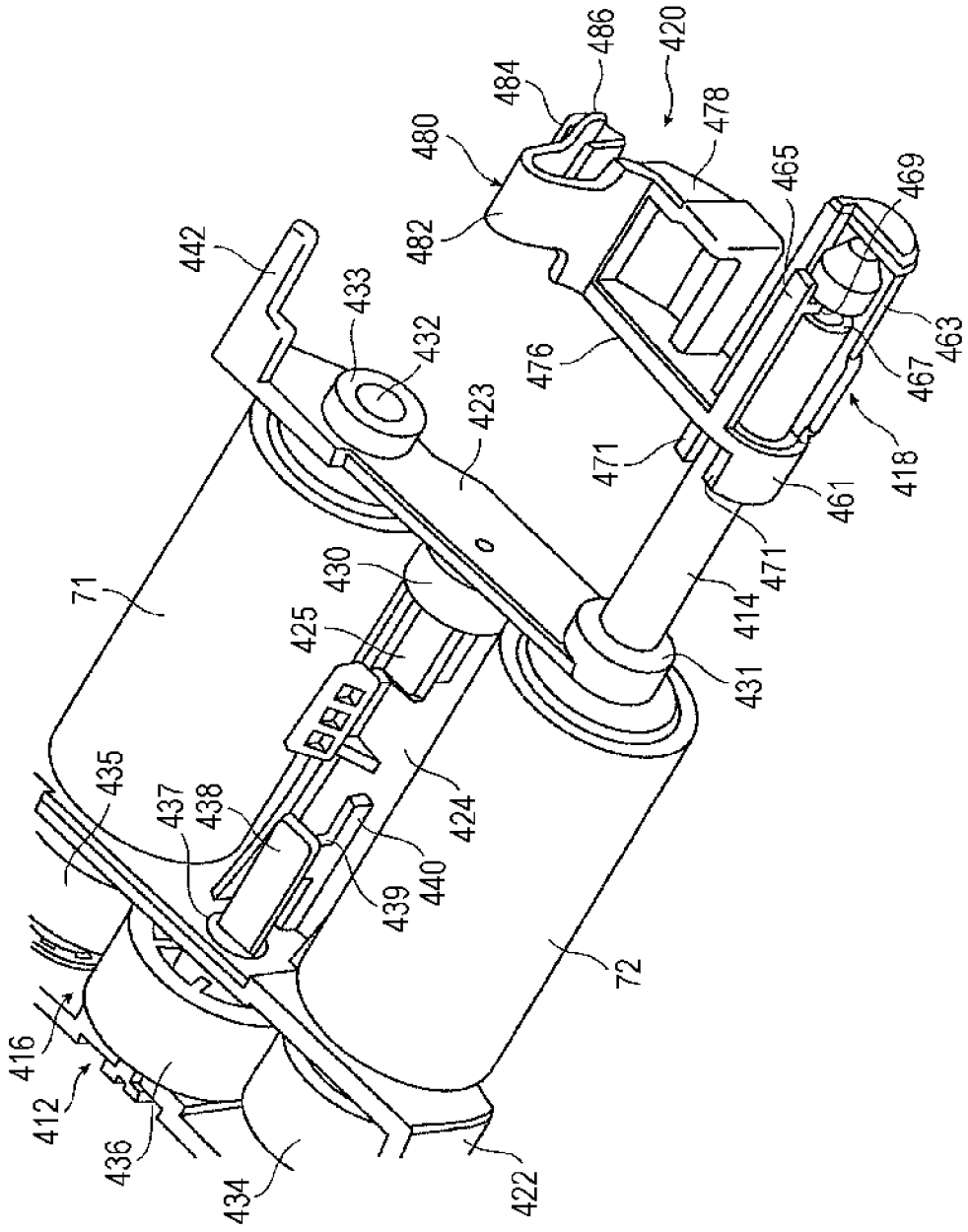
FIG. 17 is a structural perspective view illustrating the principal part of the feeding unit.

As illustrated in FIGS. 13 and 17, the holding frame 412 includes a driving frame 422 and a support frame 423. The driving frame 422 serves as an example of a first holding member disposed on one axial side (a left side in FIG. 13) of the nudger roller 71 and the feed roller 72 and shaped like a rectangular frame in plan view to house the driving-force transmission unit 416. The support frame 423 serves as an example of a second holding member disposed on the other axial side (a right side in FIG. 13) of the nudger roller 71 and the feed roller 72 and shaped like a flat plate. The driving frame 422 and the support frame 423 of the holding frame 412 are removably attached (can be separated) to allow replacement of the nudger roller 71 and the feed roller 72, as illustrated in FIG. 18.

Figure 18:
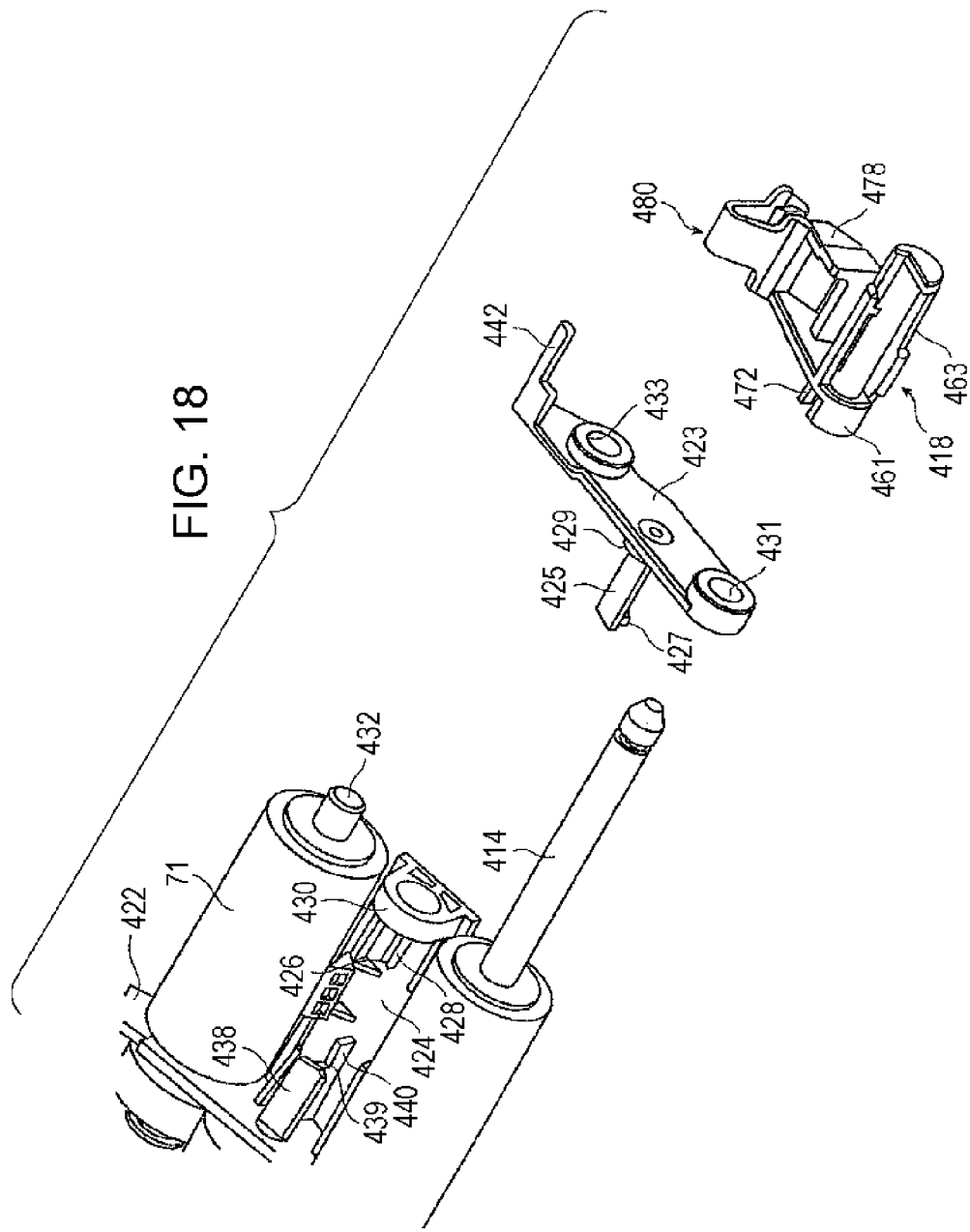
FIG. 18 is a structural perspective view illustrating an exploded state of the feeding unit.

As illustrated in FIG. 18, the driving frame 422 has, at the bottom, a flat bottom plate 424 extending toward the support frame 423. The support frame 423 is removably attached to the driving frame 422 with the bottom plate 424 being disposed therebetween. On an inner surface of the support frame 423, an engaging piece 425 shaped like a long and narrow flat plate is provided to protrude toward the driving frame 422. A claw 427 is provided on a lower surface of a distal end portion of the engaging piece 425. The claw 427 connects the support frame 423 and the driving frame 422 by being engaged with an engaging portion 426 of the driving frame 422. The engaging portion 426 of the driving frame 422 is formed by a cutout portion in a standing plate 428 provided integrally with the bottom plate 424. A base end portion 429 of the engaging piece 425 is columnar. The base end portion 429 of the engaging piece 425 is positioned by being inserted in a cylindrical positioning portion 430 provided in the bottom plate 424 of the driving frame 422. The support frame 423 further includes a support portion 431 that supports the second driving shaft 414 rotatably, and a support portion 433 that supports a rotation shaft 432 of the nudger roller 71 rotatably. By elastically deforming the engaging piece 425 to disengage the claw 427 and the engaging portion 426, the support frame 423 is detached from the driving frame 422.

On the other hand, inside the driving frame 422, as illustrated in FIGS. 13 and 17, a first gear 434 fixed to the second driving shaft 414, a second gear 435 fixed to the rotation shaft 432 of the nudger roller 71, and a third gear 436 for transmitting the rotation driving force of the first gear 434 to the second gear 435 are stored while being meshed with one another. The third gear 436 is rotatably attached to the driving frame 422 by a columnar shaft-like member 437 (see FIG. 17). The shaft-like member 437 is removably inserted in insertion holes penetrating opposed wall portions of the driving frame 422. An engaging piece 438 formed similarly to the engaging piece 425 of the support frame 423 is provided at a distal end of the shaft-like member 437. On a lower surface of a distal end portion of the engaging piece 438, an unillustrated claw is provided to fix the shaft-like member 437 to the driving frame 422 by engaging with an engaging portion 439 of the driving frame 422. The engaging portion 439 of the driving frame 422 is formed by a cutout portion in a standing plate 440 provided integrally with the bottom plate 424. The shaft-like member 437 is fixed to the driving frame 422 with the unillustrated claw of the engaging portion 439 being engaged with the engaging portion 439 of the driving frame 422. The driving-force transmission unit 416 is not limited to the one composed of the first gear 434, the second gear 435, and the third gear 436, but may be composed of a driving pulley and a driving belt. However, when the driving-force transmission unit 416 is composed of plural gears, assemblability may be increased and the cost may be reduced, in contrast to the driving pulley and the driving belt.

As illustrated in FIG. 13, the torque limiter 415 connected to a distal end of the first driving shaft 413 is fixed to an outer side surface of the driving frame 422. An end portion of the first driving shaft 413 is connected to an input side of the torque limiter 415. An end portion of the second driving shaft 414 is connected to an output side of the torque limiter 415. The torque limiter 415 is a torque limiting device that limits or interrupts transmission of the torque of the first driving shaft 413 to the second driving shaft 414 when the torque exceeds a preset value. This controls the driving torque to be transmitted from the driving motor 321 to the feed roller 72.

As illustrated in FIG. 13, operating rods 441 and 442 shaped like long and narrow plates protrude sideward from end portions of the driving frame 422 and the support frame 423 on the side of the nudger roller 71, respectively.

Figure 19:
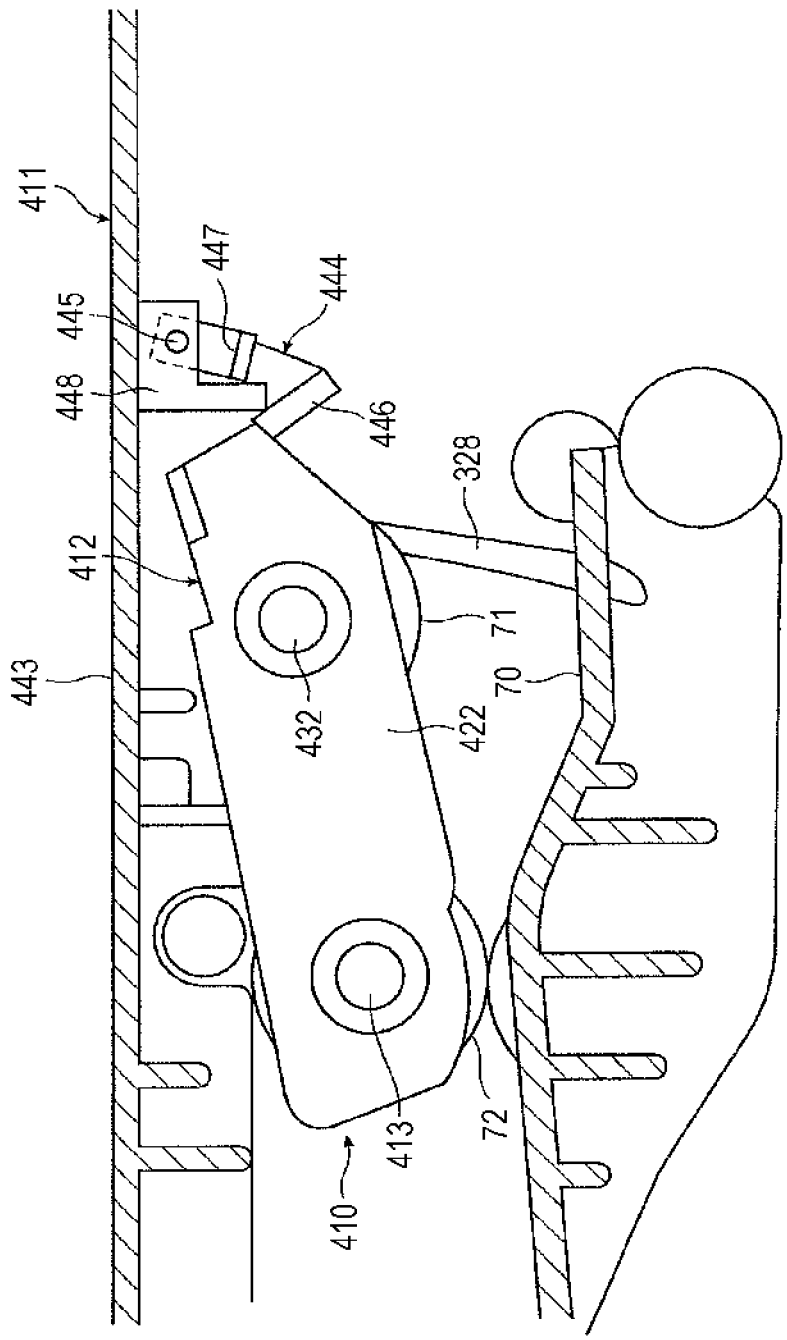
FIG. 19 is a cross-sectional structural view illustrating the principal part of the feeding unit.
Figure 20:
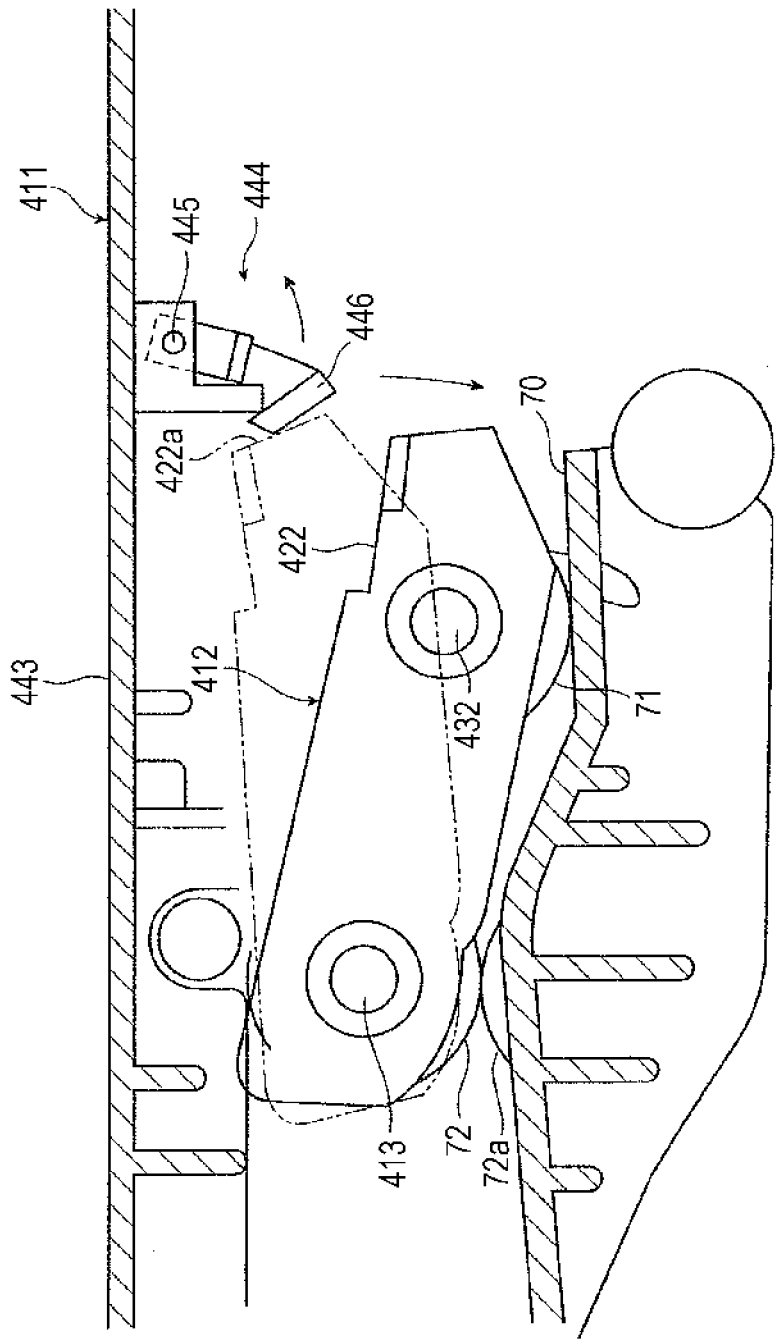
FIG. 20 is a cross-sectional structural view illustrating the principal part of the feeding unit.

During stand-by, that is, when a document 6 is not transported, the feeding unit 410 moves to a withdrawn position close to a ceiling wall 443 of the side covering 411, as illustrated in FIG. 19. The holding frame 412 of the feeding unit 410 is moved in the rotating direction of the first driving shaft 413 by the rotating force of the first driving shaft 413. When a document 6 is transported, the first driving shaft 413 is rotated in the clockwise direction in FIG. 19 by the driven gear 421 to which the rotation driving force of the driving motor 321 is transmitted. Then, as illustrated in FIG. 20, the holding frame 412 moves in the clockwise direction along with the rotation of the first driving shaft 413, and moves to a transport position where the nudger roller 71 is in pressure contact with an upper surface of an unillustrated document stored in the document storage unit 70. When the first driving shaft 413 is rotated in the counterclockwise direction in FIG. 20 at a predetermined timing, the holding frame 412 returns to the withdrawn position, as illustrated in FIG. 19. The rotational driving force of the driving motor 321 transmitted to the first driving shaft 413 is switched by the second electromagnetic clutch 324 between states in which it is transmitted and is not transmitted. After the holding frame 412 returns to the withdrawn position, the first driving shaft 413 is stopped.

Figure 25:
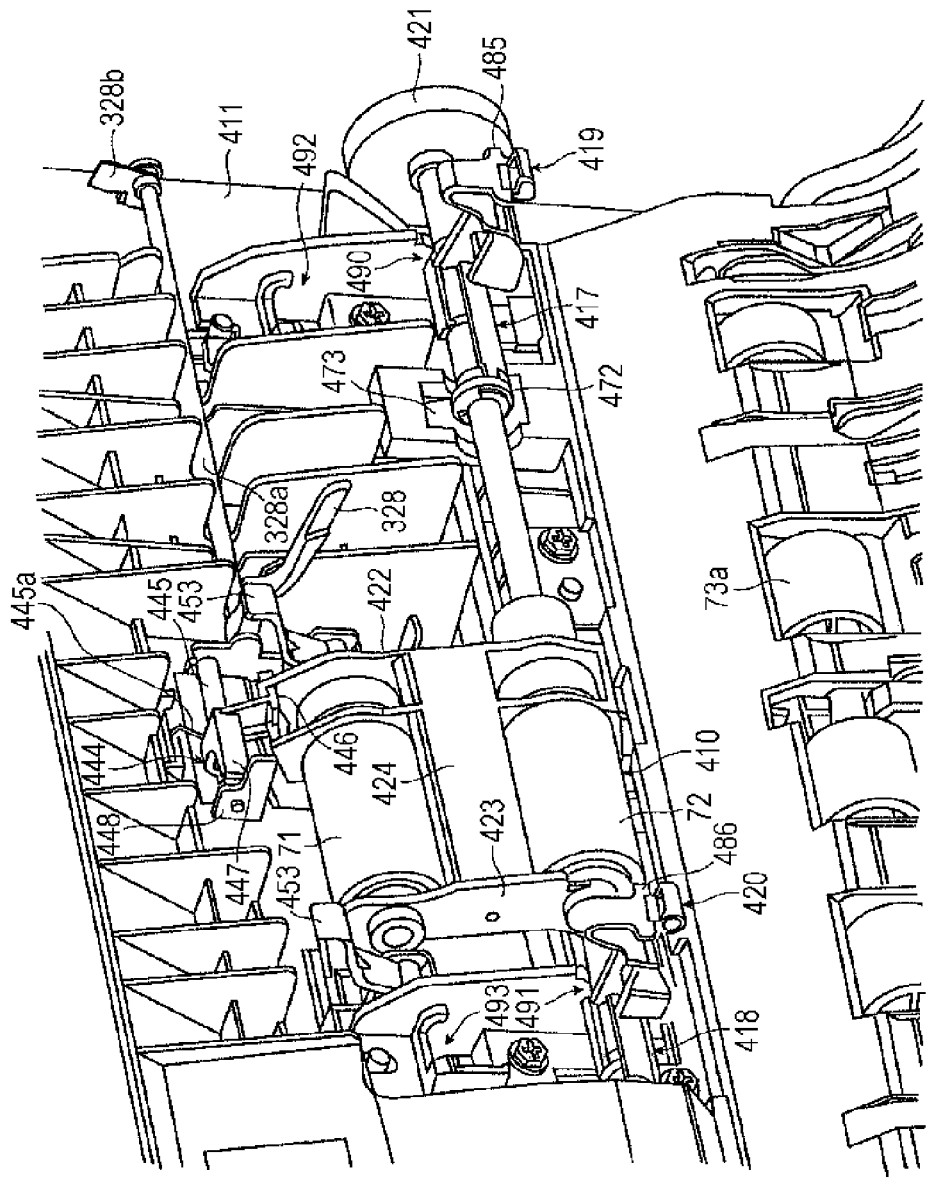
FIG. 25 is a structural perspective view illustrating an inner surface of the side covering.

As illustrated in FIGS. 19 and 25, the ceiling wall 443 of the side covering 411 is provided with a lock member 444 that holds the feeding unit 410 at the withdrawn position. The lock member 444 includes a turn shaft 445 turnably supported on an inner surface of the ceiling wall 443 and a lock arm 446 extending obliquely downward from the turn shaft 445. To the turn shaft 445 of the lock member 444, a spring 445a (see FIG. 25) is attached to bias the lock arm 446 in the clockwise direction in FIG. 19. The lock arm 446 is stopped with a distal end of a projecting portion 447 provided in a middle part abutting on an end portion of a support plate 448 that supports the turn shaft 445 turnably. A distal end portion of the lock arm 446 holds the feeding unit 410 at the withdrawn position by contact with a lower end portion of the driving frame 422 in the holding frame 412.

When the first driving shaft 413 is rotated in the clockwise direction in FIG. 19, the lock arm 446 is pushed by the lower end portion of the driving frame 422 and turned in the counterclockwise direction, as illustrated in FIG. 20. Then, the lock arm 446 and the driving frame 422 are unlocked, and the feeding unit 410 moves to the paper feed position.

As described above, the feeding unit 410 moves to the withdrawn position when the first driving shaft 413 is rotated in the counterclockwise direction in FIG. 20. At this time, the lock arm 446 of the lock member 444 comes into contact with a distal end surface 422a of the driving frame 422, is pushed by the distal end surface 422a, turns in the counterclockwise direction in FIG. 20 while slipping along the distal end surface 422a, and permits the turn of the driving frame 422, as shown by a two-dot chain line in FIG. 20. When the feeding unit 410 moves to the withdrawn position, it is held at that position by the contact of the distal end of the lock arm 446 with the lower end portion of the driving frame 422, as illustrated in FIG. 19.

Figure 21:
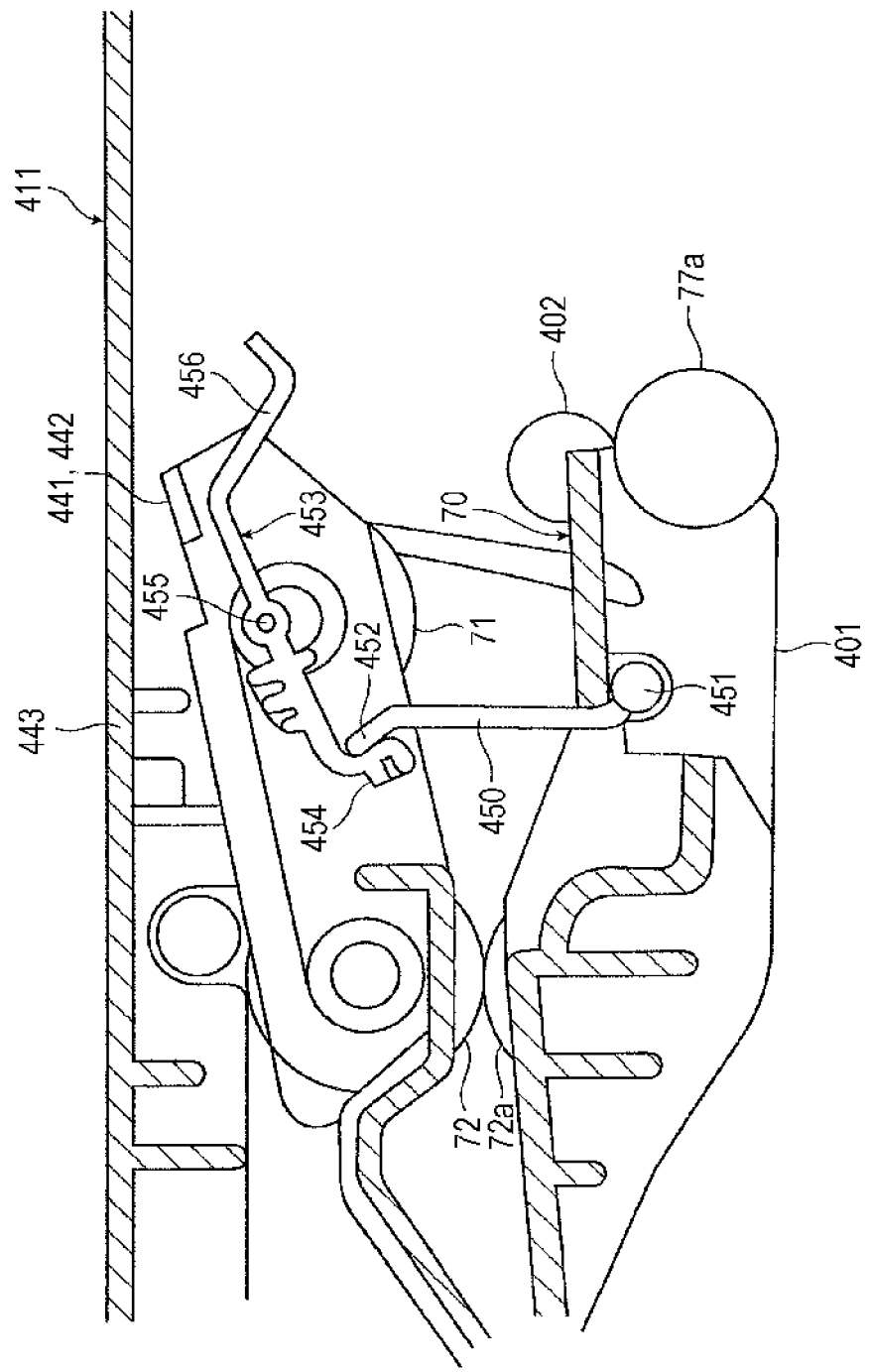
FIG. 21 is a cross-sectional structural view illustrating the principal part of the feeding unit.

Further, as illustrated in FIGS. 14 and 21, a gate member 450 serving as the reference of the set position of a leading edge of the document 6 is provided at the distal end of the document storage unit 70. The gate member 450 is provided on the upstream side of the feed roller 72 in the transport direction of the document 6 and on the downstream side of the nudger roller 71 in the transport direction of the document 6. The document 6 can be set at a proper position with its leading edge abutting on the gate member 450. The gate member 450 is provided on each side of the pressure pad 72a (see FIG. 14). A lower end portion of the gate member 450 is turnably supported on the opening and closing member 401 of the document storage unit 70 by a rotational support portion 451. An upper end portion 452 of the gate member 450 is bent toward the downstream side in the transport direction of the document 6. The gate member 450 is biased by an unillustrated spring in a direction to protrude from the upper surface of the document storage unit 70. Further, when the document 6 is transported, the gate member 450 tilts against the unillustrated spring and permits transport of the document 6 from the document storage unit 70.

In a standing state illustrated in FIG. 21, the gate member 450 is caught in a gate lock member 453 turnably provided in the side covering 411 so as not to tilt even when a force in a tilting direction (a leftward force in FIG. 21) acts when the document 6 is set. The gate lock member 453 is shaped like a band plate whose base end portion 454 engaged with the gate member 450 is bent. The gate lock member 453 is turnably attached at its middle portion to the ceiling wall 443 of the side covering 411 with a turn shaft 455 being disposed therebetween. At a distal end portion of the gate lock member 453, a bent portion 456 is provided. When the bent portion 456 comes into contact with the operating rods 441 and 442 of the holding frame 412, the turning force is applied in a direction to disengage from the gate member 450.

Figure 22:
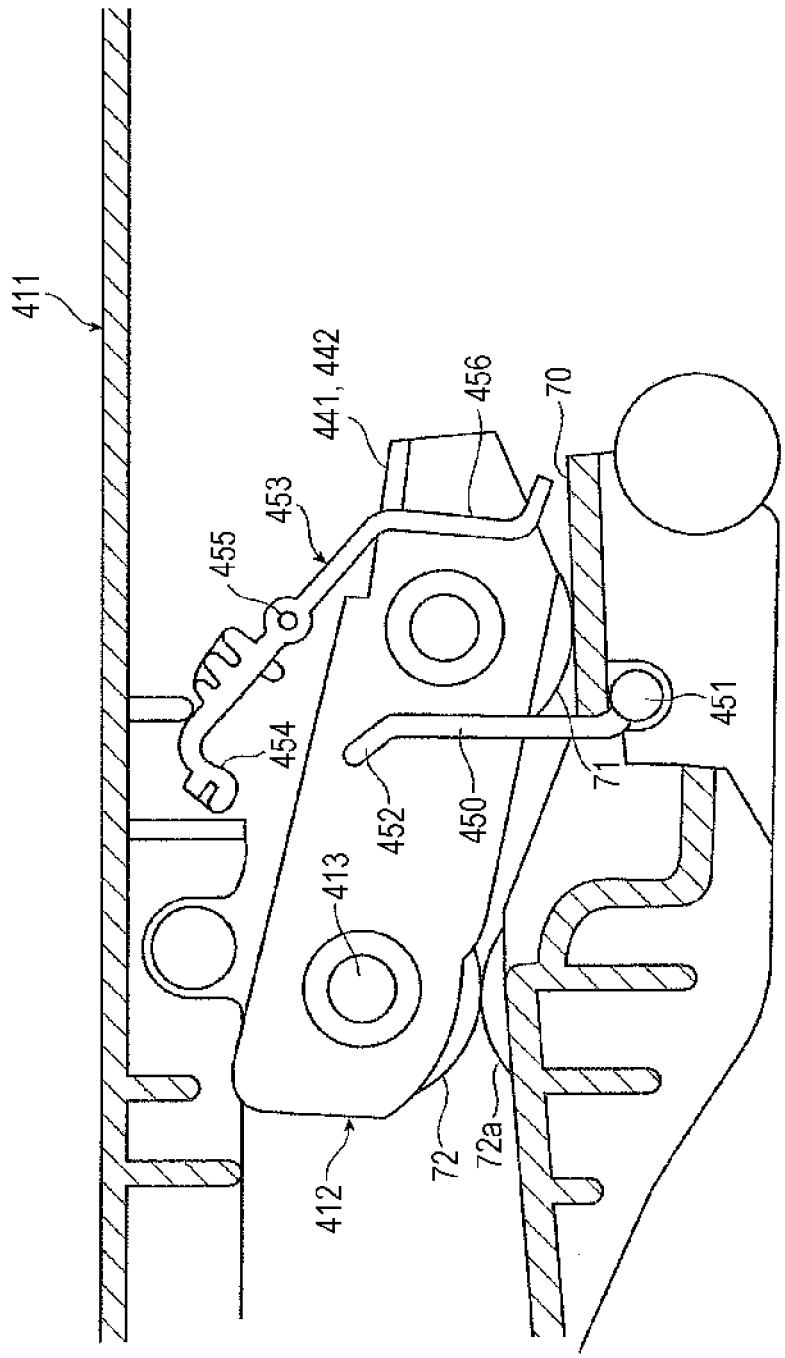
FIG. 22 is a cross-sectional structural view illustrating the principal part of the feeding unit.

As illustrated in FIG. 22, as the holding frame 412 moves to the paper feed position, the gate lock member 453 comes into contact with the operating rods 441 and 442 of the holding frame 412, and the bent portion 456 is pushed down, so that the gate lock member 453 turns in the clockwise direction in FIG. 22. Then, the base end portion 454 of the gate lock member 453 is disengaged from the gate member 450, and the gate member 450 is freed to turn in the paper feed direction.

In the exemplary embodiment, as illustrated in FIG. 13, the first and second bearing members 417 and 418 are provided as an example of a bearing member for rotatably supporting the first and second driving shafts 413 and 414 of the feeding unit 410. The first bearing member 417 supports a middle portion of the first driving shaft 413 rotatably. The second bearing member 418 supports a distal end portion of the second driving shaft 414 rotatably. The first and second bearing members 417 and 418 have a substantially similar structure.

Figure 23:
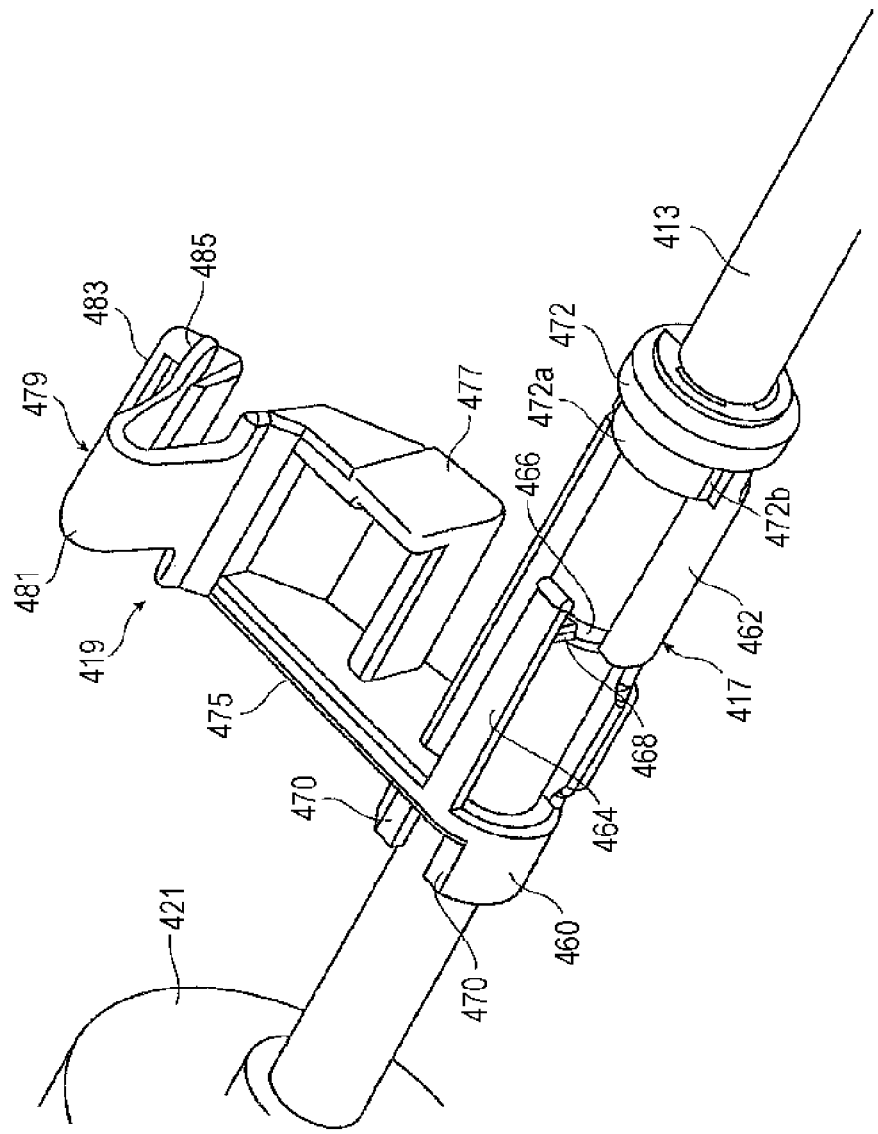
FIG. 23 is a structural perspective view illustrating the principal part of the feeding unit.
Figure 24A:
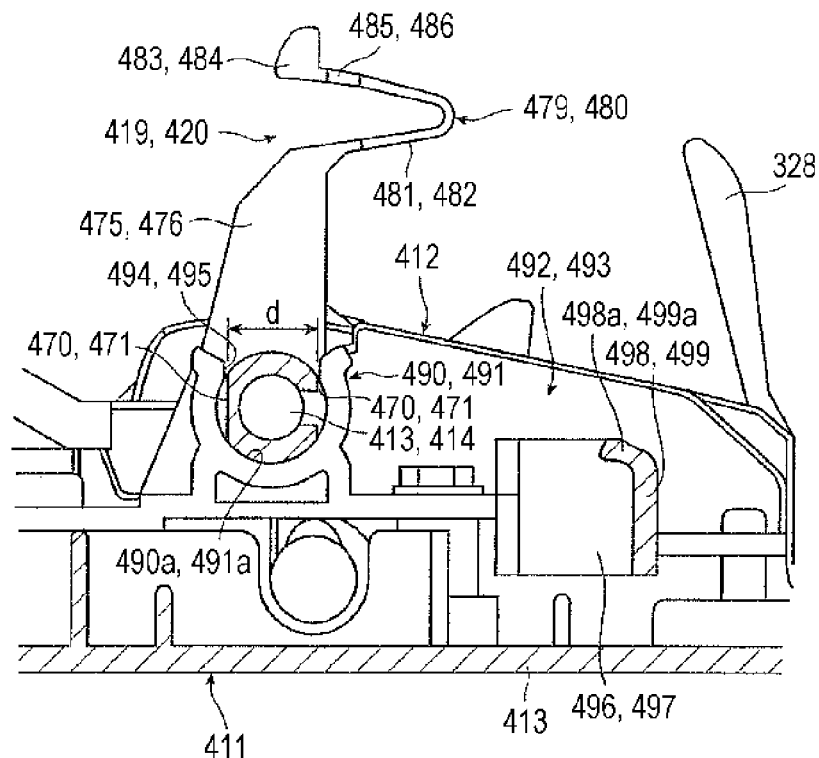
FIGS. 24A and 24B are cross-sectional structural views, respectively, illustrating a detached state of the feeding unit and an attached state of the feeding unit.

As illustrated in FIGS. 17 and 23, the first and second bearing members 417 and 418 respectively include substantially cylindrical short bearing portions 460 and 461 provided at axial end portions of the first and second driving shafts 413 and 414, semicylindrical portions 462 and 463 that are substantially semicylindrical so that the first and second driving shafts 413 and 414 are partly exposed in the axial direction of the bearing portions 460 and 461, and engaging pieces 464 and 465 extending from the bearing portions 460 and 461 toward the exposed portions of the first and second driving shafts 413 and 414 in the same direction as the semicylindrical portions 462 and 463. In distal end portions of the engaging pieces 464 and 465, restricting pieces 468 and 469 are provided to restrict the first and second bearing members 417 and 418 from moving in the axial direction of the first and second driving shafts 413 and 414 by being inserted in grooves 466 and 467 provided in the first and second driving shafts 413 and 414, respectively. Flat portions 470 and 471 are provided on the outer peripheries of the bearing portions 460 and 461, respectively. The flat portions 470 and the flat portions 471 are provided at opposed positions spaced 180 degrees apart. As illustrated in FIG. 24A, a distance d between the opposed flat portions 470 and the opposed flat portions 471 of the bearing portions 460 and 461 is set to be smaller than the outer diameter of the bearing portions 460 and 461.

As illustrated in FIG. 23, a conduction member 472 is rotatably attached to the first driving shaft 413. The conduction member 472 serves as an example of an annular metal conductive member. The conduction member 472 is fixed to a distal end of the semicylindrical portion 462 of the first bearing member 417 with flat portions 472b of a cylindrical portion 472a having a small outer diameter and integrally provided on one side of the conduction member 472. As illustrated in FIG. 25, the conduction member 472 is in contact with a leaf spring 473 provided on the inner surface of the side covering 411 so as to be connected to the ground on the side of the image reading device 3 via the leaf spring 473. The conduction member 472 serves to release charges of frictional charging generated by the contact of the nudger roller 71 and the feed roller 72 with the document 6 during paper feeding.

As illustrated in FIGS. 17 and 23, first and second fixing portions 419 and 420 are provided integrally with the first and second bearing members 417 and 418, respectively. The first and second fixing portions 419 and 420 are disposed along directions intersecting the first and second driving shafts 413 and 414. The first and second fixing portions 419 and 420 respectively include first and second arm portions 475 and 476 shaped like a flat plate in the direction intersecting the first and second driving shafts 413 and 414 in the bearing portions 460 and 461 of the first and second bearing members 417 and 418, grip portions 477 and 478 provided in middle portions of the first and second arm portions 475 and 476, and snap-fitting portions 479 and 480 provided at distal ends of the first and second arm portions 475 and 476.

The snap-fitting portions 479 and 480 respectively include leaf springs 481 and 482 bent in a substantially U-shape in side view, other grip portions 483 and 484 provided at distal ends of the leaf springs 481 and 482, and projecting pieces 485 and 486 provided at the distal ends of the leaf springs 481 and 482 to extend in a direction intersecting the leaf springs 481 and 482.

On the other hand, as illustrated in FIG. 16, the inner surface of the side covering 411 is provided with first and second rotatable support portions 490 and 491 to which the first and second bearing members 417 and 418 of the feeding unit 410 are fixed, respectively, and first and second attachment portions 492 and 493 to which the first and second fixing portions 419 and 420 are fixedly attached, respectively. As illustrated in FIG. 24A, the rotatable support portions 490 and 491 of the side covering 411 have recesses 490a and 491a, respectively, having an inner diameter corresponding to the outer diameter of the bearing portions 460 and 461 of the first and second bearing members 417 and 418. In upper end portions of the recesses 490a and 491a, openings 494 and 495 are provided, respectively. The aperture width of the openings 494 and 495 is set to be equal to or slightly larger than the distance d between the flat portions 470 and between the flat portions 471 of the bearing portions 460 and 461.

Figure 24B:
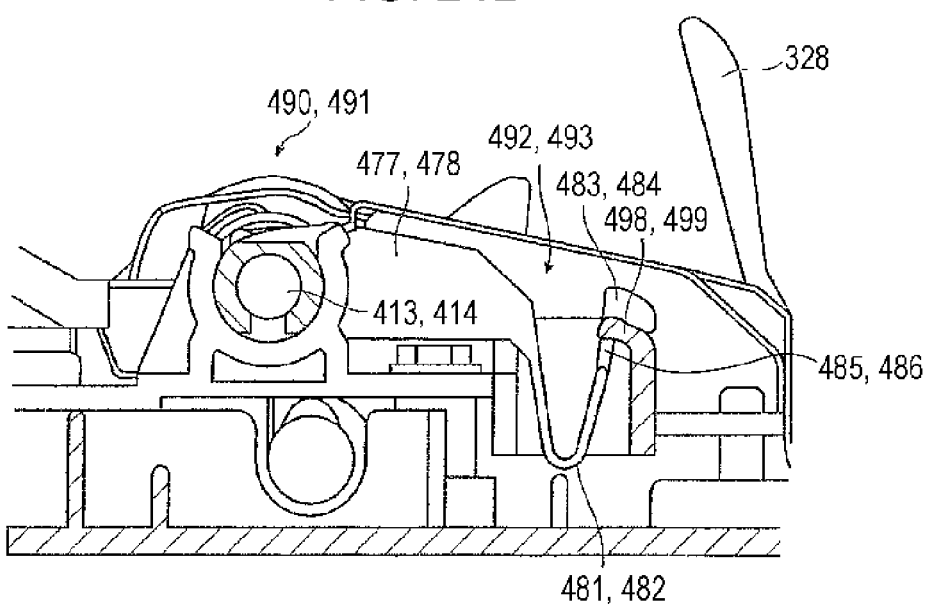
Figure 27:
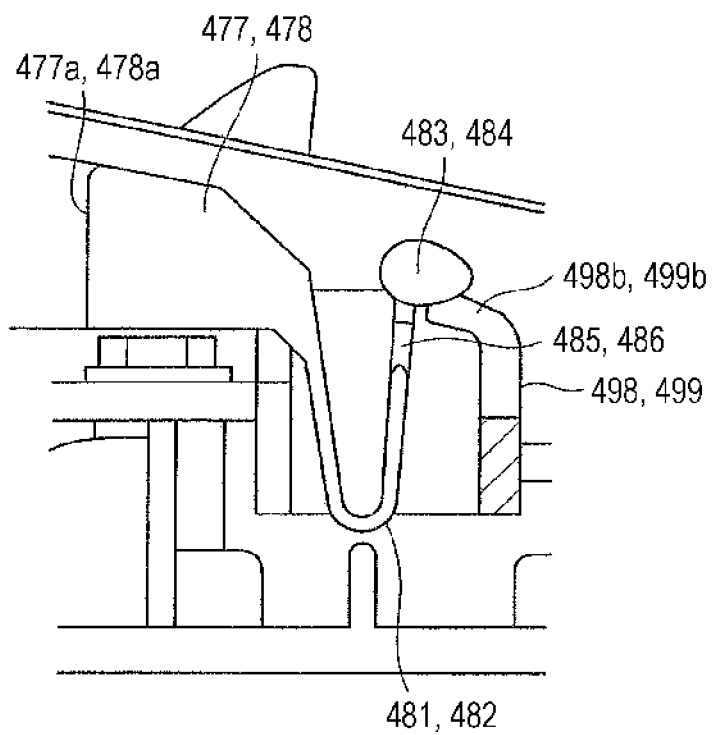
FIG. 27 is a structural view illustrating an operating state of a snap-fitting portion.

As illustrated in FIGS. 24A and 24B, the attachment portions 492 and 493 of the side covering 411 respectively have recessed portions 496 and 497 that receive the leaf springs 481 and 482 of the snap-fitting portions 479 and 480, and engaging portions 498 and 499 with which the projecting pieces 485 and 486 of the snap-fitting portions 479 and 480 are to be engaged. The engaging portions 498 and 499 are provided in a direction intersecting the ceiling wall 443 of the side covering 441, and distal end portions 498a and 499a thereof are bent to relatively engage with the projecting pieces 485 and 486 of the snap-fitting portions 479 and 480, respectively. As illustrated in FIG. 27, the attachment portions 492 and 493 respectively have recesses 498b and 499b in which the grip portions 483 and 484 of the snap-fitting portions 479 and 480 are to be inserted.

As illustrated in FIGS. 19 and 25, the document sensor 328 is disposed beside the nudger roller 71 to detect a leading edge of a document 6. The document sensor 328 is turnably attached to the side covering 411 with a rotation shaft 328a being disposed therebetween. At a distal end of the rotation shaft 328a, a light shielding plate 328b is provided to optically detect the position of the document sensor 328 with an unillustrated position sensor. As illustrated in FIGS. 14 and 15, the light shielding plate 328b is detected by the unillustrated position sensor provided on the side of the document press covering 42 in a state in which the side covering 411 is closed.

Operations of Characteristic Parts of Image Forming Apparatus

In the image reading device 3 of the exemplary embodiment, the feeding unit 410 is replaced as follows.

That is, as illustrated in FIG. 3, in the image reading device 3, when a document 6 stored in the document storage unit 70 is transported, the driving motor 321 is rotated in the forward direction. Thus, as illustrated in FIGS. 20 and 22, the feeding unit 410 moves to the paper feed position, the nudger roller 71 is brought into pressure contact with a surface of the unillustrated document 6 stored in the document storage unit 70, and transport of the document 6 is started.

For this reason, in the image reading device 3, when multiple documents 6 are transported, the nudger roller 71 and the feed roller 72 sometimes wear with time and paper dust of the documents 6 is sometimes attached to the nudger roller 71 and the feed roller 72. For example, if the nudger roller 71 and the feed roller 72 wear in the image reading device 3, the documents 6 are not normally transported during feeding. This may cause transport failure of the documents 6 or cause so-called jamming of the documents 6.

In the exemplary embodiment, as illustrated in FIG. 16, the feeding unit 410 in which the nudger roller 71 and the feed roller 72 are mounted can be replaced. To replace the feeding unit 410, the side covering 411 of the image reading device 3 is opened, as illustrated in FIGS. 14 and 15. When the side covering 411 of the image reading device 3 is opened, as illustrated in FIGS. 14 and 26, the feeding unit 410 attached to the inner surface of the side covering 411 is exposed outside.

Figure 26:
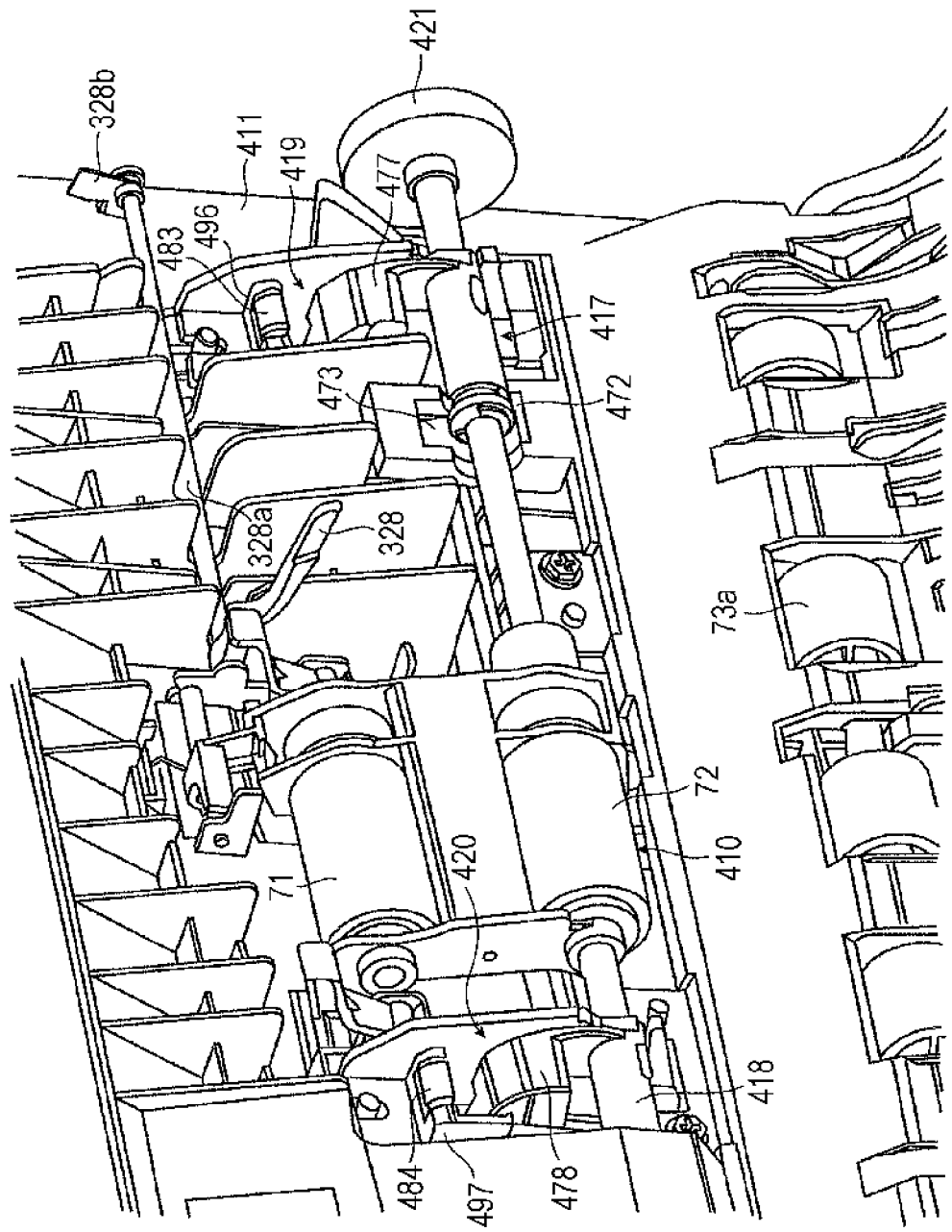
FIG. 26 is a structural perspective view illustrating the inner surface of the side covering.

Next, as illustrated in FIGS. 24B and 26, the user or the service engineer operates the snap-fitting portions 479 and 480 provided on the first and second bearing members 417 and 418 in the feeding unit 410 to disengage the snap-fitting portions 479 and 480 from the attachment portions 492 and 493 of the side covering 411. As illustrated in FIG. 27, the engaging portions 498 and 499 of the attachment portions 492 and 493 and the projecting pieces 485 and 486 of the snap-fitting portions 479 and 480 are disengaged by elastically deforming the leaf springs 481 and 482 while pinching the side surfaces 477a and 478a of the grip portions 477 and 478 and the other grip portions 483 and 484, for example, between the thumb and the forefinger. By turning the first and second fixing portions 419 and 420 about 90 degrees in the counterclockwise direction in FIG. 24A in this state, the bearing portions 460 and 461 of the first and second bearing members 417 and 418 are freed to be detached from the attachment portions 492 and 493 of the side covering 411 via the flat portions 470 and 471. Hence, by moving the first and second fixing portions 419 and 420 upward with the hand in the state of FIG. 24A, the bearing portions 460 and 461 of the first and second bearing members 417 and 418 are detached from the side covering 411 through the openings 494 and 495 of the attachment portions 492 and 493 of the side covering 411.

After that, in the feeding unit 410, as illustrated in FIG. 18, the nudger roller 71 and the feed roller 72 can be replaced by separating the driving frame 422 and the support frame 423 of the holding frame 412. As illustrated in FIG. 18, it is necessary to first remove the second bearing member 418 from the second driving shaft 414 in order to detach the support frame 423 from the second driving shaft 414. Further, in the state in which at least one of the nudger roller 71 and the feed roller 72 is separated from the holding frame 412, the nudger roller 71 and the feed roller 72 may be easily cleaned without being replaced.

To assemble the feeding unit 410 after the nudger roller 71, the feed roller 72, and so on are replaced, as illustrated in FIG. 18, it is only necessary to connect the support frame 423 to the driving frame 422 by fitting the support frame 423 on the second driving shaft 414 and the rotation shaft 432 of the nudger roller 71.

After that, as illustrated in FIG. 24A, in the feeding unit 410, the first and second bearing members 417 and 418 are attached to the attachment portions 492 and 493 of the side covering 411 and the first and second fixing portions 419 and 420 provided integrally with the first and second bearing members 417 and 418 are turned in the clockwise direction in FIG. 24A by an operation in reverse order to the operation of detachment. Further, as illustrated in FIGS. 24B and 25, the first and second fixing portions 419 and 420 are fixed to the attachment portions 492 and 493 of the side covering 411.

The foregoing description of the exemplary embodiment of the present invention has been provided for the purposes of illustration and description. It is not intended to be exhaustive or to limit the invention to the precise forms disclosed. Obviously, many modifications and variations will be apparent to practitioners skilled in the art. The embodiment was chosen and described in order to best explain the principles of the invention and its practical applications, thereby enabling others skilled in the art to understand the invention for various embodiments and with the various modifications as are suited to the particular use contemplated. It is intended that the scope of the invention be defined by the following claims and their equivalents.

What is claimed is:

1. A sheet transport device comprising:
a feeding unit configured to feed out a sheet from a sheet stack unit;
a driving shaft configured to rotate the feeding unit;
a plurality of bearing members configured to support the driving shaft rotatably at a plurality of positions in an axial direction and restrict movement of the driving shaft in the axial direction; and
a fixing member provided integrally with each of the bearing members to removably fix each of the bearing members to an opening and closing member configured to be opened and closed relative to the sheet stack unit,
wherein the fixing member is provided in a direction intersecting the driving shaft, and a distal end portion of the fixing member has a fixing portion to be snap-connected to the opening and closing member.

2. The sheet transport device according to claim 1,
wherein the feeding unit includes a feed roller fixed to the driving shaft, a nudger roller to which rotation driving force is transmitted from the driving shaft, and first and second holding members disposed at opposite axial end portions of the feed roller and the nudger roller to hold the feed roller and the nudger roller rotatably, and
wherein the first and second holding members are removably attached to each other in an axial direction of a rotation shaft that supports the nudger roller rotatably.

3. The sheet transport device according to claim 2,
wherein one of the bearing members comprises a conductive member that ensures electrical conduction via the driving shaft, and the conductive member is in contact with a member for conduction provided in the opening and closing member.

4. The sheet transport device according to claim 1,
wherein one of the bearing members comprises a conductive member that ensures electrical conduction via the driving shaft, and the conductive member is in contact with a member for conduction provided in the opening and closing member.

5. An image reading device comprising:
a reading unit configured to read an image on a document; and
a document transport unit configured to transport the document to the reading unit,
wherein the sheet transport device according to claim 1 is used as the document transport unit.

6. An image forming apparatus comprising:
the image reading device according to claim 5 configured to read an image on a document; and
an image recording device configured to record the image read by the image reading device on a recording medium.

* * * * *